(12) United States Patent
Uchida et al.

(10) Patent No.: US 9,252,211 B2
(45) Date of Patent: Feb. 2, 2016

(54) SEMICONDUCTOR DEVICE AND MANUFACTURING METHOD THEREOF

(71) Applicant: Panasonic Intellectual Property Management Co., Ltd., Osaka (JP)

(72) Inventors: Masao Uchida, Osaka (JP); Osamu Kusumoto, Nara (JP); Nobuyuki Horikawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/714,226

(22) Filed: May 15, 2015

(65) Prior Publication Data

US 2015/0349051 A1 Dec. 3, 2015

(30) Foreign Application Priority Data

May 28, 2014 (JP) ................................. 2014-110025

(51) Int. Cl.
| | |
|---|---|
| *H01L 29/15* | (2006.01) |
| *H01L 29/745* | (2006.01) |
| *H01L 21/00* | (2006.01) |
| *H01L 21/338* | (2006.01) |
| *H01L 29/06* | (2006.01) |
| *H01L 27/06* | (2006.01) |
| *H01L 29/872* | (2006.01) |

(52) U.S. Cl.
CPC ........ *H01L 29/0619* (2013.01); *H01L 27/0629* (2013.01); *H01L 29/872* (2013.01)

(58) Field of Classification Search
CPC .............. H01L 29/1608; H01L 29/872; H01L 29/7811; H01L 2924/1306; H01L 29/0653; H01L 2224/49175; H01L 29/66212; H01L 21/02529; H01L 21/0495; H01L 21/8213; H01L 29/1075; H01L 21/02378; H01L 2224/94
USPC ........... 257/77, 213, 256, 267, 272, 280, 326, 257/337
See application file for complete search history.

(56) References Cited

U.S. PATENT DOCUMENTS

| | | | |
|---|---|---|---|
| 5,886,383 A | 3/1999 | Kinzer | |
| 8,471,267 B2 * | 6/2013 | Hayashi | ................ H01L 21/045 257/77 |
| 2003/0080355 A1 | 5/2003 | Shirai et al. | |
| 2008/0035990 A1 | 2/2008 | Matsuura et al. | |
| 2009/0225578 A1 | 9/2009 | Kitabatake | |
| 2010/0148718 A1 | 6/2010 | Kitabatake et al. | |
| 2013/0248996 A1 | 9/2013 | Ogasawara et al. | |

FOREIGN PATENT DOCUMENTS

| | | |
|---|---|---|
| JP | 2003-133557 | 5/2003 |
| JP | 2008-042056 | 2/2008 |
| JP | 2009-194127 | 8/2009 |

(Continued)

*Primary Examiner* — Hsien Ming Lee
(74) *Attorney, Agent, or Firm* — McDermott Will & Emery LLP

(57) ABSTRACT

A semiconductor device includes a first silicon carbide semiconductor layer of a first conductive type that is positioned on a front surface of a substrate of the first conductive type, a transistor region that includes transistor cells, a Schottky region, and a boundary region. The boundary region includes a second body region and a gate connector that is arranged on the second body region via an insulating film and electrically connected with a gate electrode. The Schottky region includes a Schottky electrode that is arranged on the first silicon carbide semiconductor layer.

9 Claims, 18 Drawing Sheets

(56) References Cited

FOREIGN PATENT DOCUMENTS

| | | |
|---|---|---|
| JP | 2010-109221 | 5/2010 |
| JP | 2010-225615 | 10/2010 |
| JP | 2013-201286 | 10/2013 |
| WO | 2007/007670 | 1/2007 |
| WO | 2007/013367 | 2/2007 |

* cited by examiner

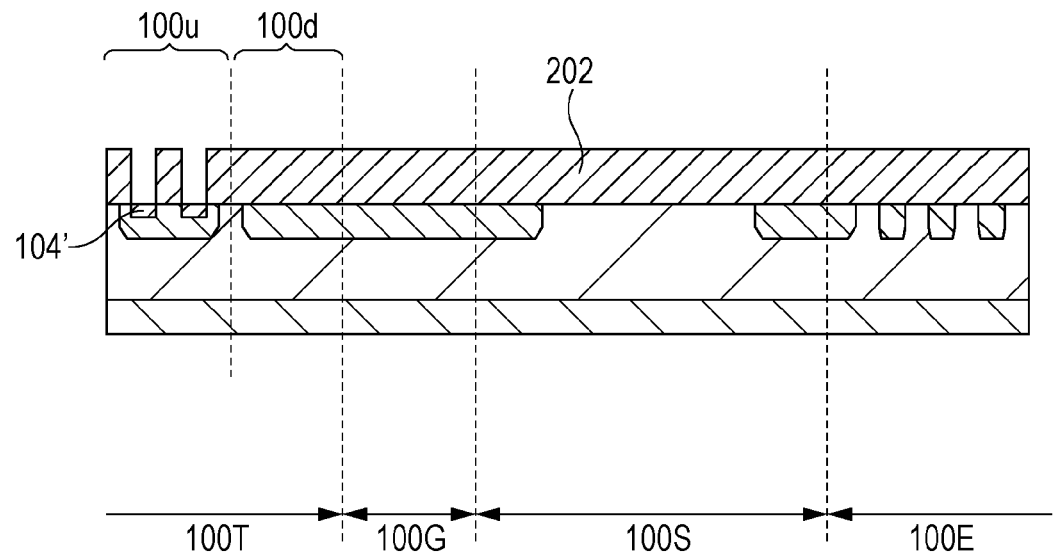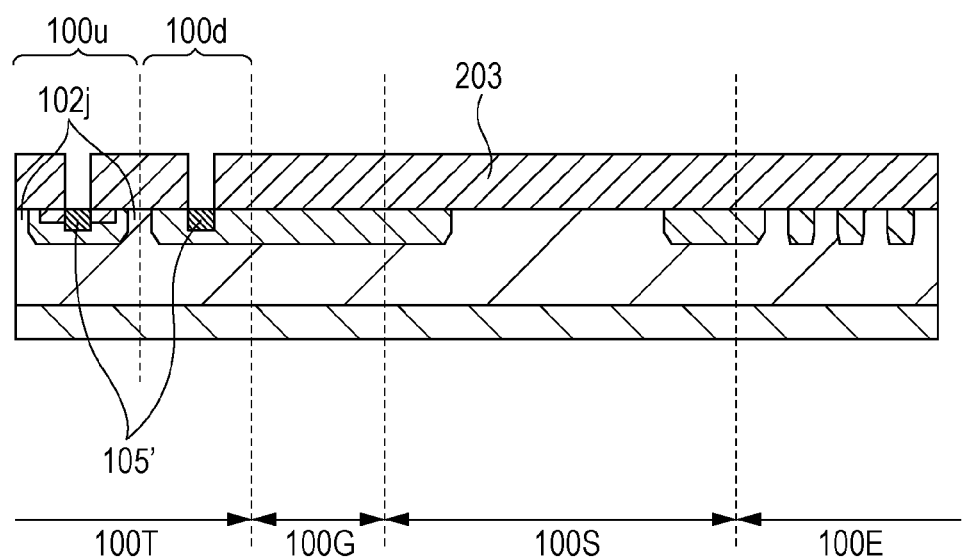

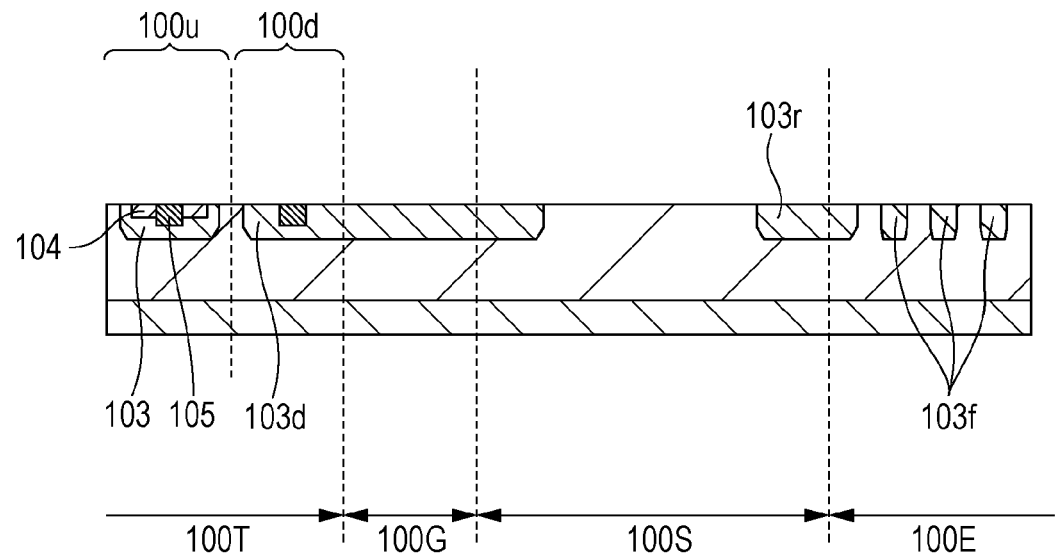
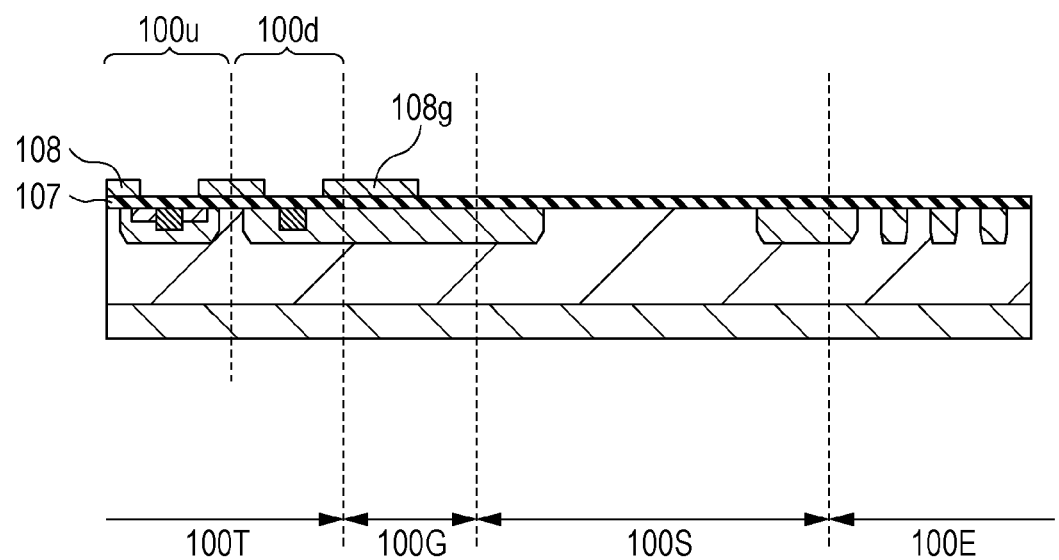

SEMICONDUCTOR DEVICE AND MANUFACTURING METHOD THEREOF

BACKGROUND

1. Technical Field

The present disclosure relates to a semiconductor device and a manufacturing method thereof and particularly to a semiconductor device that includes silicon carbide and a manufacturing method thereof.

2. Description of the Related Art

Silicon carbide (SiC) is a semiconductor material that has a large band gap and higher hardness compared to silicon (Si). For example, SiC has been applied to power devices such as switching devices and rectifier devices. The power device that uses SiC has an advantage of reducing power loss compared to a power device that uses Si, for example.

Representative semiconductor devices that use SiC are a metal-insulator-semiconductor field-effect transistor (MIS-FET) and a Schottky-barrier diode (SBD). A metal-oxide-semiconductor field-effect transistor (MOSFET) is one kind of MISFET. Further, a junction-barrier Schottky-barrier diode (JBS) is one kind of SBD.

A discussion has been held that an SiC-MISFET is used as the switching device used for a power converter or the like that drives and controls a load of a motor or the like, for example. In a case where the MISFET is used as the switching device of the power converter, there is a case where a return current flows in the power converter when the MISFET is in an OFF state. In a common inverter circuit, a free-wheeling diode is externally connected with the MISFET in an antiparallel manner, and the free-wheeling diode thereby becomes a path of the return current. In a case where an SiC-FET is applied to the inverter circuit, the Schottky-barrier diode formed of SiC is selected as the free-wheeling diode.

However, in a case where each of a transistor and a diode that functions as the free-wheeling diode is formed with an independent semiconductor chip, a mounting area may increase in response to an increase in the total number of chips. Further, because inter-chip wiring increases, a parasitic inductance may increase, and noise may occur. Thus, a configuration has been suggested that the transistor and the diode are formed in a single semiconductor chip. Herein, the transistor in such a configuration will be referred to as "transistor with a build-in diode".

International Publication No. 2007/013367 by the inventor discloses an example where diode cells that have a Schottky electrode are arranged along an outer periphery in which plural transistor cells are formed in a field effect transistor that uses SiC, for example, in the SiC-MISFET. In this example, the Schottky-barrier diode connected with the MISFET in an anti-parallel manner may be formed in the chip, and the semiconductor chip that has both of a switching function of the MISFET and a function of the free-wheeling diode may thus be obtained.

SUMMARY

It is desired that a transistor with a built-in diode be tolerant to further higher voltage and larger current.

One non-limiting and exemplary embodiment provides a semiconductor device that includes a metal-insulator-semiconductor field-effect transistor (MISFET) and a Schottky-barrier diode (SBD) in the same device and enables realization of tolerance to high voltage and large current.

In one general aspect, the techniques disclosed here feature a semiconductor device including: a substrate which has a front surface and a back surface; a first silicon carbide semiconductor layer of a first conductive type which is arranged on the front surface of the substrate; a body region of a second conductive type that is positioned at least in a portion of a surface of the first silicon carbide semiconductor layer; a source region of the first conductive type that contacts with the body region; a gate insulating film that covers at least a portion of the body region; a gate electrode that is arranged on the gate insulating film; a source electrode that is electrically connected with the source region; a drain electrode that is arranged on the back surface of the substrate; a second body region of the second conductive type that is positioned at least in a portion of the surface of the first silicon carbide semiconductor layer; a gate connector that is arranged on the second body region via an insulating film and electrically connected with the gate electrode; a guard ring region of the second conductive type that is positioned at least in a portion of the surface of the first silicon carbide semiconductor layer; a Schottky electrode that is arranged on a portion of the guard ring region and on the first silicon carbide semiconductor layer; at least one ring region of the second conductive type that is positioned in the surface of the first silicon carbide semiconductor layer; a first electrode that is electrically connected with the second body region; an upper wiring layer that connects the source electrode and the first electrode with the Schottky electrode; gate wiring that is electrically connected with the gate connector; and a gate pad that is electrically connected with the gate connector and the gate wiring. A region that includes the body region, the source region, the gate insulating film, the gate electrode, the source electrode and the drain electrode is defined as a transistor cell. A region that includes a plurality of the transistor cells is defined as a transistor region. A region that includes the second body region and the gate connector is defined as a boundary region. A region that includes the guard ring region and the Schottky electrode is defined as a Schottky region. A region that includes the at least one ring region is defined as an edge termination region. The boundary region is positioned between the transistor region and the Schottky region when the boundary region is seen in a normal line direction of the front surface of the substrate. The Schottky region surrounds the transistor region when the Schottky region is seen in the normal line direction of the front surface of the substrate. The edge termination region is arranged outside of the transistor region, the Schottky region, and the boundary region when the edge termination region is seen in the normal line direction of the front surface of the substrate. At least a portion of the gate wiring and at least a portion of the gate pad are arranged in the boundary region. The second body region extends from the boundary region to the Schottky region and is arranged below a portion of the Schottky electrode.

One aspect of the present disclosure enables realization of tolerance to high voltage and large current in a semiconductor device that includes a MISFET and a SBD in the same device.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIGS. 5A and 5B are process cross-sectional views for explaining one example of the manufacturing method of the semiconductor device;

FIGS. 6A and 6B are process cross-sectional views for explaining one example of the manufacturing method of the semiconductor device;

DETAILED DESCRIPTION

Figure 1:
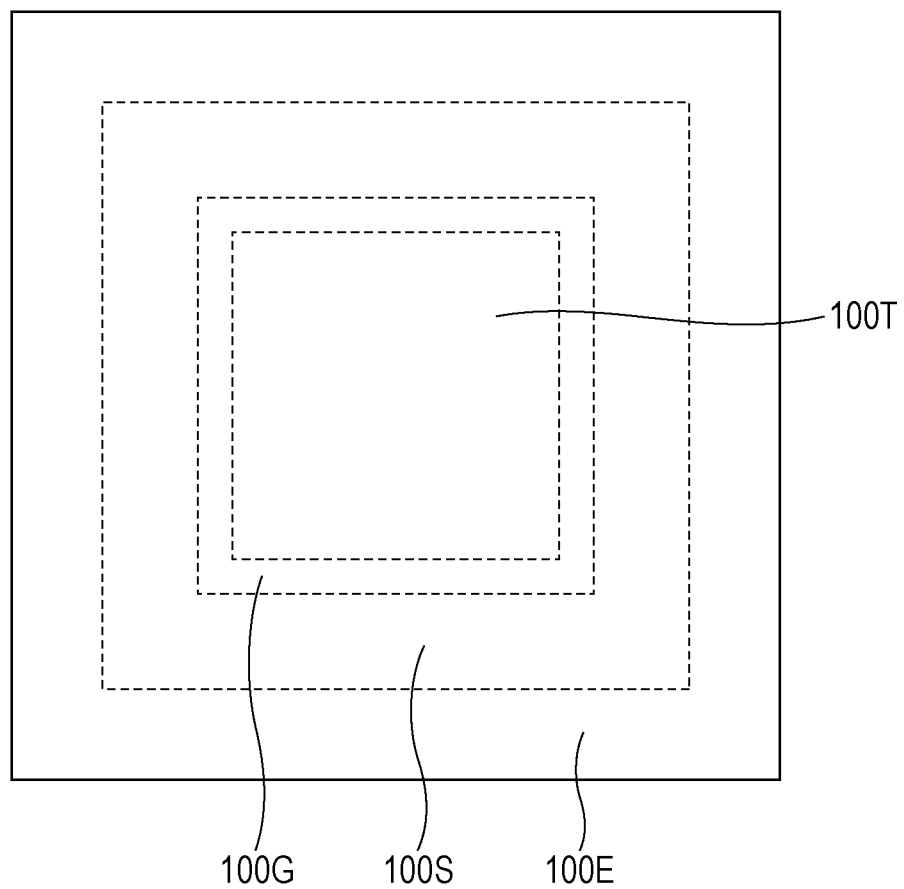
FIG. 1 is a conceptual diagram that illustrates a virtual region of a semiconductor device of a first embodiment.

One aspect of a semiconductor device of the present disclosure is a semiconductor device including: a substrate which has a front surface and a back surface and a first silicon carbide semiconductor layer of a first conductive type which is arranged on the front surface of the substrate; a body region of a second conductive type that is positioned at least in a portion of a surface of the first silicon carbide semiconductor layer; a source region of the first conductive type that contacts with the body region; a gate insulating film that covers at least a portion of the body region; a gate electrode that is arranged on the gate insulating film; a source electrode that is electrically connected with the source region; a drain electrode that is arranged on the back surface of the substrate; a second body region of the second conductive type that is positioned at least in a portion of the surface of the first silicon carbide semiconductor layer; a gate connector that is arranged on the second body region via an insulating film and electrically connected with the gate electrode; a guard ring region of the second conductive type that is positioned at least in a portion of the surface of the first silicon carbide semiconductor layer; a Schottky electrode that is arranged on a portion of the guard ring region and on the first silicon carbide semiconductor layer; at least one ring region of the second conductive type that is positioned in the surface of the first silicon carbide semiconductor layer; a first electrode that is electrically connected with the second body region; an upper wiring layer that connects the source electrode and the first electrode with the Schottky electrode; gate wiring that is electrically connected with the gate connector; and a gate pad that is electrically connected with the gate connector and the gate wiring. A region that includes the body region, the source region, the gate insulating film, the gate electrode, the source electrode and the drain electrode is defined as a transistor cell. A region that includes a plurality of the transistor cells is defined as a transistor region. A region that includes the second body region and the gate connector is defined as a boundary region. A region that includes the guard ring region and the Schottky electrode is defined as a Schottky region. A region that includes the at least one ring region is defined as an edge termination region. The boundary region is positioned between the transistor region and the Schottky region when the boundary region is seen in a normal line direction of the front surface of the substrate. The Schottky region surrounds the transistor region when the Schottky region is seen in the normal line direction of the front surface of the substrate. The edge termination region is arranged outside of the transistor region, the Schottky region, and the boundary region when the edge termination region is seen in the normal line direction of the front surface of the substrate. At least a portion of the gate wiring and at least a portion of the gate pad are arranged in the boundary region. The second body region extends from the boundary region to the Schottky region and is arranged below a portion of the Schottky electrode.

The at least one ring region may comprise plural ring regions that are arranged at intervals in the surface of the first silicon carbide semiconductor layer, for example.

Another aspect of the semiconductor device of the present disclosure may further include a barrier metal layer that is arranged between the upper wiring layer and the source electrode, between the upper wiring layer and the first electrode, and between the gate wiring and the gate connector.

The barrier metal layers and the Schottky electrode may be made of a same metal material, for example.

Another aspect of the semiconductor device of the present disclosure may further include a second silicon carbide semiconductor layer of the first conductive type between the first silicon carbide semiconductor layer and the gate insulating film. The transistor cell may further include the second silicon carbide semiconductor layer.

The second silicon carbide semiconductor layer may further be arranged between the Schottky electrode and the first silicon carbide semiconductor layer.

An impurity concentration of the first conductive type in a contact surface of the second silicon carbide semiconductor layer that contacts with the Schottky electrode may be lower than an average impurity concentration of the second silicon carbide semiconductor layer in a thickness direction.

The second silicon carbide semiconductor layer may be an epitaxial layer, for example.

Another aspect of the semiconductor device of the present disclosure may further include at least one second conductive type region that is arranged at an interval from the second body region and the guard ring region in a portion of the surface of the first silicon carbide semiconductor layer. The Schottky region may further include the at least one second conductive type region. The Schottky electrode may contact with both of the at least one second conductive type region and a region of the first conductive type in the first silicon carbide semiconductor layer.

A manufacturing method of a semiconductor device of one aspect of the present disclosure is a manufacturing method of a semiconductor device that includes a substrate which has a front surface and a back surface, a first silicon carbide semiconductor layer of a first conductive type which is arranged on the front surface of the substrate, a transistor region which includes plural transistor cells, a Schottky region, and a boundary region which is positioned between the transistor region and the Schottky region when the boundary region is seen in a normal line direction of the front surface of the substrate, the manufacturing method including: (a) a step of preparing the substrate that has the first silicon carbide semiconductor layer on the front surface, in which the first silicon carbide semiconductor layer has a body region of a second conductive type that is positioned at least in a portion of a surface of the first silicon carbide semiconductor and a source region of a first conductive type that is arranged to contact with an interior of the body region in the transistor region, has a second body region of the second conductive type that is positioned at least in a portion of the surface of the first silicon carbide semiconductor layer in the boundary region, and has a guard ring region of the second conductive type that is positioned at least in a portion of the surface of the first silicon carbide semiconductor layer in the Schottky region; (b) a step of forming gate insulating films at least on the body region and the second body region; (c) a step of forming a gate electrode that is arranged on the body region in the transistor region via the gate insulating film and a gate connector that is arranged on the second body region in the boundary region via the gate insulating film by forming a gate electrode conductive film on the gate insulating film and processing the gate electrode conductive film into a prescribed shape, in which the gate connector is electrically connected with the gate electrode; (d) a step of forming an interlayer insulating film that covers the gate electrode and the gate insulating film; (e) a step of forming a source contact hole that exposes the source region and a body contact hole that exposes the second body region in the interlayer insulating film and the gate insulating film; (f) a step of forming a source electrode that contacts with the source region in the transistor region and a first electrode that contacts with the second body region by forming a source electrode conductive film on the interlayer insulating film and in the source contact hole and the body contact hole and processing the source electrode conductive film into a prescribed shape; (g) a step of forming a gate contact hole that exposes the gate connector in the boundary region and a Schottky contact hole that exposes a region of the first conductive type in the first silicon carbide semiconductor layer and a portion of the guard ring region in the Schottky region in the interlayer insulating film and the gate insulating film; (h) a step of forming barrier metal layers on the source electrode, on the first electrode, on the gate connector that is exposed by the gate contact hole, and on the region of the first conductive type and the portion of the guard ring region that are exposed by the Schottky contact hole; (i) a step of forming a drain electrode on the back surface of the substrate; and (j) a step of forming an upper wiring layer that is positioned in the transistor region and the Schottky region and in parallel connects the source electrode and the first electrode with the barrier metal layers that are formed on the region of the first conductive type and the portion of the guard ring region that are exposed by the Schottky contact hole and gate wiring and a gate pad that are positioned in the boundary region and electrically connected with the gate connector by forming wiring metal films on the barrier metal layers and processing the wiring metal films into prescribed shapes.

A manufacturing method of a semiconductor device of one aspect of the present disclosure is a manufacturing method of a semiconductor device that includes a substrate which has a front surface and a back surface, a first silicon carbide semiconductor layer of a first conductive type which is arranged on the front surface of the substrate, a transistor region which includes plural transistor cells, a Schottky region, and a boundary region which is positioned between the transistor region and the Schottky region when the boundary region is seen in a normal line direction of the front surface of the substrate, the manufacturing method including: (A) a step of preparing the substrate that has the first silicon carbide semiconductor layer on the front surface, in which the first silicon carbide semiconductor layer has a body region of a second conductive type that is positioned at least in a portion of a surface of the first silicon carbide semiconductor and a source region of a first conductive type that is arranged to contact with an interior of the body region in the transistor region, has a second body region of the second conductive type that is positioned at least in a portion of the surface of the first silicon carbide semiconductor layer in the boundary region, and has a guard ring region of the second conductive type that is positioned at least in a portion of the surface of the first silicon carbide semiconductor layer in the Schottky region; (B) a step of forming a second silicon carbide semiconductor layer of the second conductive type on the first silicon carbide semiconductor layer; (C) a step of forming gate insulating films on portions of the second silicon carbide semiconductor layer that are positioned on the body region and on the second body region; (D) a step of forming a gate electrode that is arranged on the body region in the transistor region via the gate insulating film and a gate connector that is arranged on the second body region in the boundary region via the gate insulating film by forming gate electrode conductive films on the gate insulating films and processing the gate electrode conductive films into prescribed shapes, in which the gate connector is electrically connected with the gate electrode; (E) a step of forming an interlayer insulating film that covers the gate electrode and the gate insulating film; (F) a step of forming a source contact hole that exposes the source region and a body contact hole that exposes the second body region in the interlayer insulating film and the gate insulating film; (G) a step of forming a source electrode that contacts with the source region in the transistor region and a first electrode that contacts with the second body region by forming source electrode conductive films on the interlayer insulating film and in the source contact hole and the body contact hole and processing the source electrode conductive films into prescribed shapes; (H) a step of forming a gate contact hole that exposes the gate connector in the boundary region and a Schottky contact hole that exposes the second silicon carbide semiconductor layer in the Schottky region in the interlayer insulating film and the gate insulating film; (I) a step of forming barrier metal layers on the source electrode, on the first electrode, on the gate connector that is exposed by the gate contact hole, and on the second silicon carbide semiconductor layer that is exposed by the Schottky contact hole; (J) a step of forming a drain electrode on the back surface of the substrate; and (K) a step of forming an upper wiring layer that is positioned in the transistor region and the Schottky region and in parallel connects the source electrode and the first electrode with the barrier metal layer that is formed on the second silicon carbide semiconductor layer that is exposed by the Schottky contact hole and gate wiring and a gate pad that are positioned in the boundary region and electrically connected with the gate connector by forming wiring metal films on the barrier metal layers and processing the wiring metal films into prescribed shapes.

First Embodiment

A semiconductor device of a first embodiment according to the present disclosure will hereinafter be described. Here, a description will be made about an SiC-MISFET with a built-in diode as an example. However, the semiconductor device of this embodiment may be a device in which a diode and a field effect transistor are formed in a single device and with a same silicon carbide semiconductor layer.

The semiconductor device of this embodiment is an SiC-MISFET that is configured with plural unit cells (transistor cells) and has a Schottky-barrier diode (SBD), for example. In general, an SBD has an anode and a cathode as electrodes, and a MISFET has source, drain, and gate electrodes. However, in the semiconductor device of this embodiment, the anode of the SBD and the source electrode of the MISFET are used in common, and the cathode of the SBD and the drain electrode of the MISFET are used in common.

FIG. 1 is a top view that exemplarily illustrates a virtual region in the semiconductor device of this embodiment. The semiconductor device of this embodiment are virtually separated into a transistor region 100T that includes the plural transistor cells, a Schottky region 100S that includes the Schottky-barrier diode, and a boundary region 100G. The boundary region 100G is provided with gate wiring and a gate pad. In this example, the Schottky region 100S is arranged to surround the transistor region 100T. The boundary region 100G is arranged between the transistor region 100T and the Schottky region 100S. The semiconductor device may further have an edge termination region 100E. The edge termination region 100E is arranged outside of the transistor region 100T, the boundary region 100G, and the Schottky region 100S. In the example illustrated in FIG. 1, the edge termination region 100E is arranged outside of the Schottky region 100S.

The semiconductor device of this embodiment will be described further in detail below.

Figure 2A:
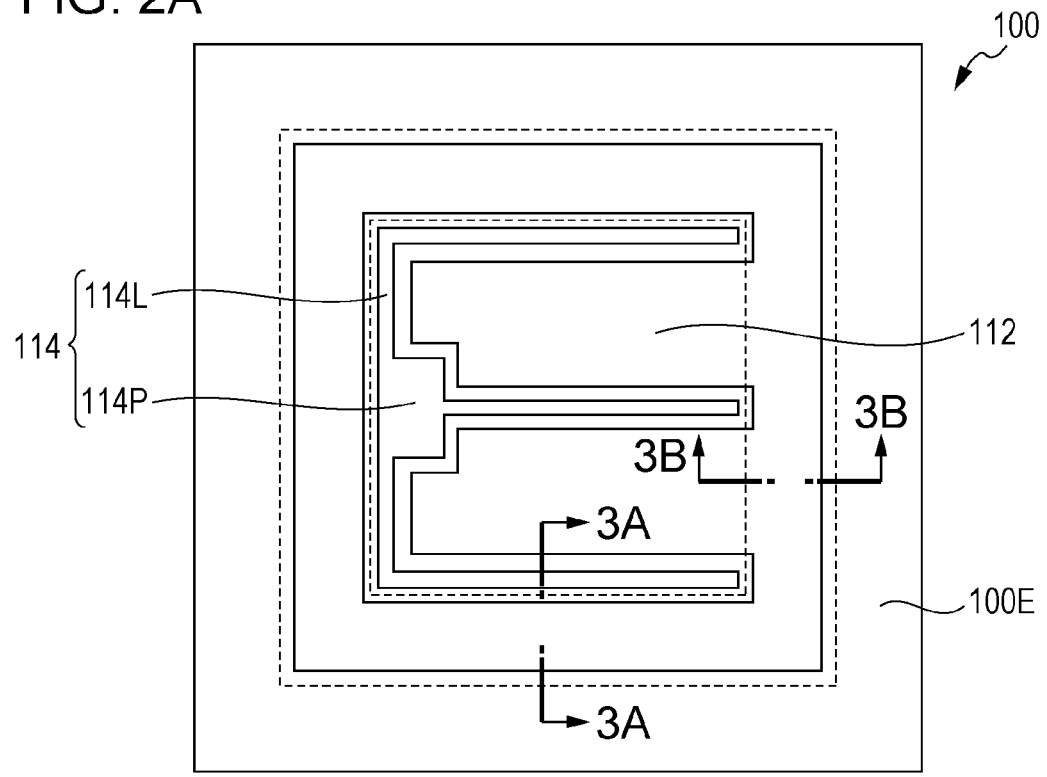
FIG. 2A is a top view that illustrates arrangement of a gate wiring layer (including wiring and a pad) and an upper wiring layer.
Figure 2B:
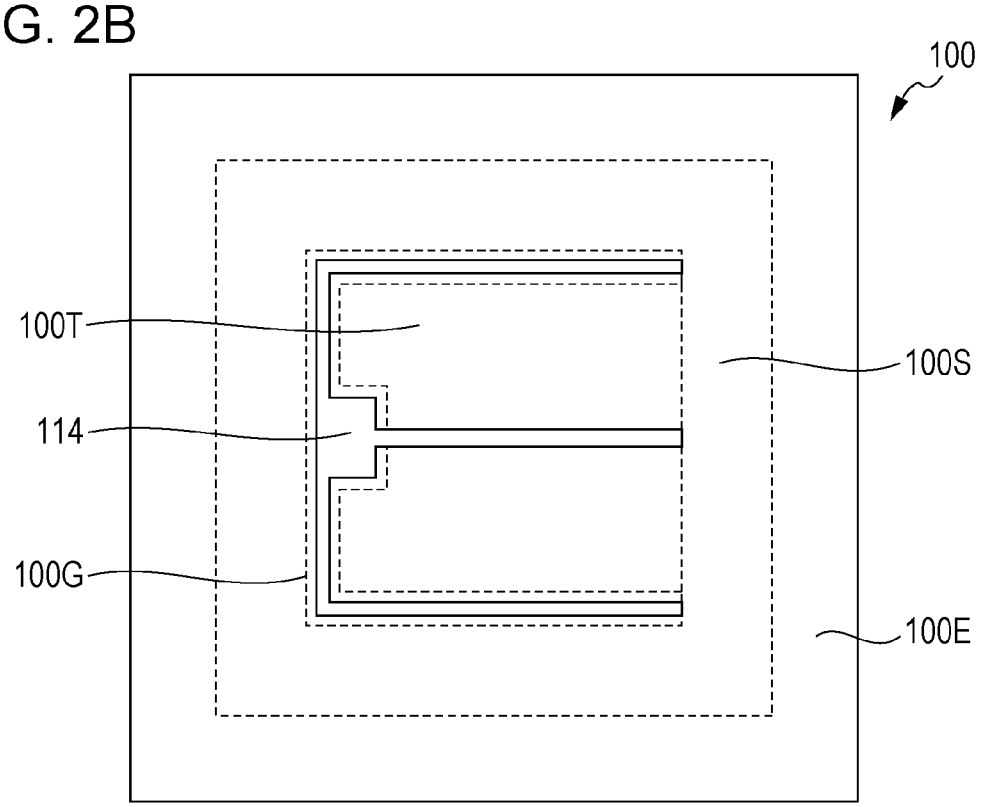
FIG. 2B is a top view that illustrates arrangement of a transistor region, a Schottky region, and a boundary region.

FIGS. 2A, 2B, 3A, and 3B illustrate a configuration of the semiconductor device 100 as one example of this embodiment. FIG. 2A is a schematic top view that illustrates arrangement of a gate wiring layer and an upper wiring layer of the semiconductor device 100. FIG. 2B is a schematic top view that illustrates arrangement of the transistor region 100T, the Schottky region 100S, and the boundary region 100G in the semiconductor device 100.

As illustrated in FIG. 2A, the semiconductor device 100 has a gate wiring layer 114 that is electrically connected with the gate electrodes of the plural transistor cells and the upper wiring layer 112 that is electrically connected with the source electrodes and Schottky electrodes in the plural transistor cells. The upper wiring layer 112 and the gate wiring layer 114 are insulated from each other. The gate wiring layer 114 includes a gate pad 114P and gate wiring 114L that extends from the gate pad 114P. The gate pad 114P and the gate wiring 114L are electrically connected together. The upper wiring layer 112, the gate pad 114P, and the gate wiring 114L may be formed of a same conductive layer.

Herein, as long as "gate wiring layer" is a wiring layer for connecting the gate electrodes of the respective transistor cells together, "gate wiring layer" may include not only the gate pad but also the gate wiring extended from the gate pad. The gate wiring extends to connect the gate electrodes of the adjacent transistor cells together. The width of the gate wiring is narrower than the width of the gate pad. The width of the gate wiring is equal to or wider than a cell pitch between the transistor cells and equal to or narrower than the length of the short side of the gate pad. The cell pitch between the transistor cells is 5 μm, for example. The length of the short side of the gate pad is 200 μm, for example. Similarly, as long as "upper wiring layer" is a wiring layer for connecting the source electrodes of the respective transistor cells together, "upper wiring layer" may include not only a source pad but also source wiring extended from the source pad. The upper wiring layer may be configured by integrally forming the source pad, the source wiring, and the anode (referred to as "upper electrode") of the Schottky electrode. The gate pad and the source pad are pads for wire bonding, for example.

As it is understood from FIGS. 2A and 2B, in the semiconductor device 100, the boundary region 100G is arranged in a portion of the boundary between the transistor region 100T and the Schottky region 100S. A portion of the transistor region 100T adjoins the Schottky region 100S. Thus, the source electrode of the transistor region 100T and the anode of the Schottky region 100S may be connected together by the upper wiring layer 112 in a region where the transistor region 100T adjoins the Schottky region 100S. Further, at least a portion of the gate wiring 114L and at least a portion of the gate pad 114P are arranged in the boundary region 100G.

In the illustrated example, the upper wiring layer 112 is arranged in at least a portion of the transistor region 100T and at least a portion of the Schottky region 100S. The upper wiring layer 112 may have a pattern that integrally includes a first portion that is arranged in the transistor region 100T and electrically connected with the source electrode and a second portion that is arranged in the Schottky region 100S and electrically connected with the Schottky electrode. A portion of the gate wiring 114L and the gate pad 114P of the gate wiring layer 114 are arranged in the boundary region 100G. A portion of the gate wiring 114L is arranged in the transistor region 100T.

A cross-sectional structure of the semiconductor device 100 will next be described with reference to FIGS. 3A and 3B.

Figure 3A:
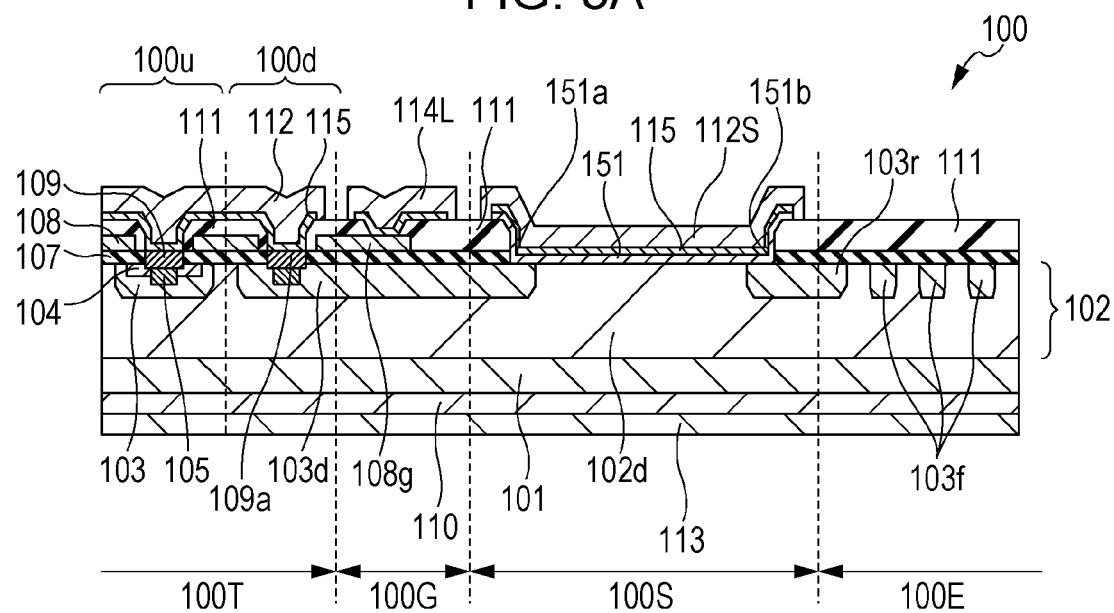
FIGS. 3A and 3B are cross-sectional views taken along line 3A-3A and line 3B-3B of a semiconductor device illustrated in FIG. 2A.
Figure 3B:
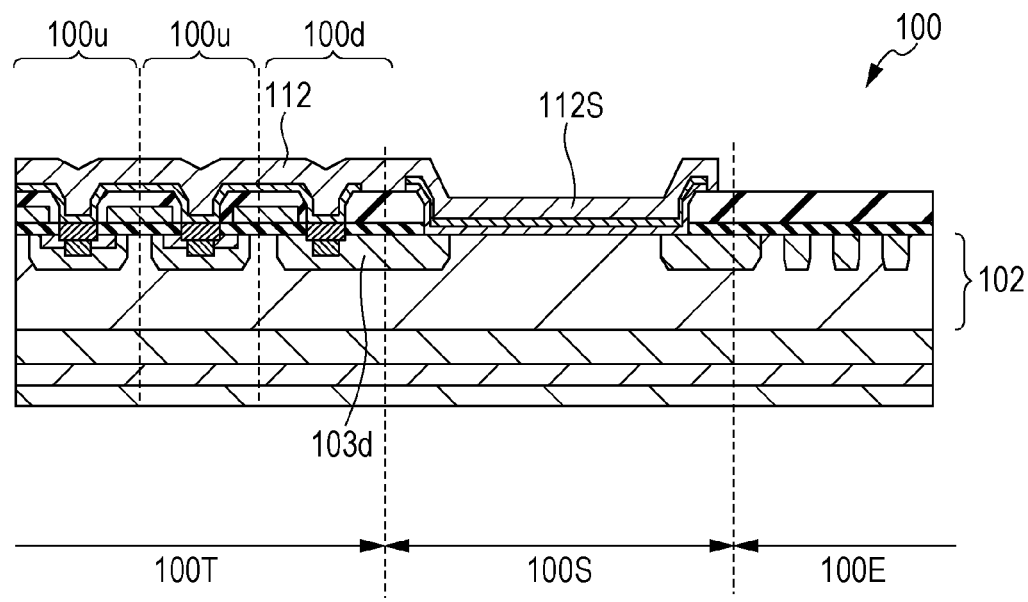

FIGS. 3A and 3B are cross-sectional views taken along line 3A-3A and line 3B-3B of the semiconductor device 100 illustrated in FIG. 2A. FIG. 3A illustrates a cross section that corresponds to the transistor region 100T, the boundary region 100G, the Schottky region 100S, and the edge termination region 100E in the semiconductor device 100. FIG. 3B illustrates a cross section that corresponds to the transistor region 100T, the Schottky region 100S, and the edge termination region 100E. In the cross section illustrated in FIG. 3A, the boundary region 100G is arranged between the transistor region 100T and the Schottky region 100S. On the other hand, in the cross section illustrated in FIG. 3B, the transistor region 100T adjoins the Schottky region 100S.

The semiconductor device 100 includes a substrate 101 and a first silicon carbide semiconductor layer (drift layer) 102 of a first conductive type that is positioned on a main surface of the substrate 101. Here, a description will be made about an example where the first conductive type is an n-type and a second conductive type is a p-type. The first conductive type may be the p-type, and the second conductive type may be the n-type. A silicon carbide substrate that has $n^+$-type conductivity is used as the substrate 101, for example. The first silicon carbide semiconductor layer 102 is of an $n^-$-type. The superscript "+" or "−" of the n or p conductive type represents a relative concentration of impurities. The character "$n^+$" means that an n-type impurity concentration is higher than "n", and "$n^-$" means that the n-type impurity concentration is lower than "n".

Plural transistor cells 100u are arrayed in the transistor region 100T. The plural transistor cells 100u are connected in parallel. The single transistor cell 100u has a square shape, for example, when the semiconductor device 100 is seen in the normal line direction of the main surface of the substrate 101. The transistor cell 100u may have a rectangular shape or a polygonal shape other than a rectangle or may be a long unit cell that extends in one direction.

Each of the transistor cells 100u includes a body region 103 of the second conductive type that is positioned at least in a portion of a surface of the first silicon carbide semiconductor layer 102, a source region 104 of the first conductive type that is positioned in the body region 103, a gate insulating film 107 that covers at least a portion of the body region 103, a gate electrode 108, a source electrode 109, and a drain electrode 110. A region of the first conductive type where second conductive type regions such as the body region 103 and a second body region 103d are not formed in the first silicon carbide semiconductor layer 102 is a drift region 102d. In this embodiment, the body region 103 is of the p-type, and the source region 104 is of the $n^+$-type.

The gate insulating film 107 covers at least the body region 103 that is exposed on the surface of the first silicon carbide semiconductor layer 102 in each of the transistor cells 100u. In this example, the gate insulating film 107 contacts with the body region 103. As described below, a channel layer may be provided between the body region 103 and the gate insulating film 107.

The gate electrode 108 is arranged on the body region 103 via the gate insulating film 107. Here, the gate electrode 108 is positioned above a portion of the body region 103 interposed between the drift region 102d and the source region 104 of the first conductive type on the surface of the first silicon carbide semiconductor layer 102. The portion of the body region 103 interposed between the drift region 102d and the source region 104 corresponds to a region where a channel is formed.

The source electrode 109 is provided on the first silicon carbide semiconductor layer 102 and electrically connected with the source region 104. In this example, the source electrode 109 forms ohmic junction with respect to the source region 104. A contact region 105 of the second conductive type that has a higher impurity concentration than the body region 103 may be provided in the body region 103. In this embodiment, the contact region 105 is of the $p^+$-type. The contact region 105 contacts with the body region 103. The source electrode 109 is arranged to contact with both of the source region 104 and the contact region 105 and electrically connected with both of the source region 104 and the contact region 105. The source electrode 109 may form the ohmic junction with both of the source region 104 and the contact region 105. In a case where the impurity concentration of the body region 103 is sufficiently high, the contact region 105 may not be provided. In this case, a contact trench that exposes the body region 103 is provided in the source region 104, the source electrode 109 is formed in the trench, and the body region 103 may thereby directly contact with the source electrode 109.

The drain electrode 110 is arranged on a surface on the opposite side to the main surface of the substrate 101 (back surface). A back surface electrode 113 may be formed on the drain electrode 110.

In this embodiment, an interlayer insulating film 111 is formed to cover the gate electrode 108 in the transistor region 100T. The upper wiring layer 112 is provided on the interlayer insulating film 111. The upper wiring layer 112 is electrically connected with the source electrode 109 of each of the transistor cells 100u in a contact hole that is provided in the interlayer insulating film 111. As illustrated in FIG. 3A, a barrier metal layer 115 may be provided on the interlayer insulating film 111 and in the contact hole. In this case, the upper wiring layer 112 is provided on the interlayer insulating film 111 via the barrier metal layer 115. The upper wiring layer 112 is connected with the source electrode 109 via the barrier metal layer 115.

The boundary region 100G has the second body region 103d of the second conductive type that is positioned at least in a portion of the surface of the first silicon carbide semiconductor layer 102, a gate connection section 108g that is electrically connected with the gate electrode 108, and the gate wiring layer 114 that is electrically connected with the gate connection section 108g. In this embodiment, the gate electrode 108 and the gate connection section 108g are formed of a same conductive film. In this embodiment, the second body region 103d is of the p-type. The second body region 103d is formed to surround the plural transistor cells 100u when seen in the normal line direction of the main surface of the substrate 101. The gate wiring layer 114 includes the gate pad 114P and the gate wiring 114L that extends from the gate pad 114P.

It is sufficient that the second body region 103d is arranged at least in the boundary region 100G. In this embodiment, the second body region 103d extends from the transistor region 100T across the boundary region 100G to the Schottky region 100S. The second body region 103d is preferably separated from the body region 103 in the transistor cell 100u. The second body region 103d may simultaneously be formed with the body region 103 in a similar process to the body region 103. In this case, the impurity concentrations and depths of the second body region 103d and the body region 103 may be almost the same.

The gate connection section 108g is arranged on the second body region 103d via an insulating film. In this embodiment, the gate connection section 108g is arranged on the second body region 103d via the gate insulating film 107. In this embodiment, the gate electrode 108 of the transistor cell 100u that adjoins the boundary region 100G extends to the boundary region 100G and functions as the gate connection section 108g. The gate wiring layer 114 is arranged on the gate connection section 108g. The barrier metal layer 115 may be arranged between the gate wiring layer 114 and the interlayer insulating film 111. The gate wiring layer 114 is electrically connected with the gate electrode 108 and the gate connection section 108g via the barrier metal layer 115. In the example illustrated in FIG. 3B, the barrier metal layer 115 is split at the boundary between the transistor region 100T and the Schottky region 100S but may be connected together.

A first electrode 109a that is electrically connected with the second body region 103d is provided on the second body region 103d. The first electrode 109a may directly contact with the second body region 103d or may contact with the contact region 105 that is provided in the second body region 103d. The source electrode 109 of the transistor cell 100u and the first electrode 109a are connected in parallel with the upper wiring layer 112.

As an example that will be described below, the first electrode 109a may be arranged in the transistor region 100T. In addition, the first electrode 109a may be arranged closer to a Schottky electrode 151 than the gate wiring layer 114 when seen in the normal line direction of the main surface of the substrate 101. The first electrode 109a may also be arranged in the Schottky region 100S, for example.

The Schottky region 100S has a guard ring region 103r of the second conductive type that is positioned at least in a portion of the surface of the first silicon carbide semiconductor layer 102 and the Schottky electrode 151 that forms Schottky junction with respect to an upper surface of the first silicon carbide semiconductor layer 102. In this embodiment, the guard ring region 103r is of the p-type. The guard ring region 103r may be formed to surround the transistor region 100T when seen in the normal line direction of the main surface of the substrate 101. The guard ring region 103r may simultaneously be formed with the body region 103 and the second body region 103d in a similar process to the body region 103 and the second body region 103d. The Schottky electrode 151 contacts with a region of the first conductive type on the surface of the first silicon carbide semiconductor layer 102 that is positioned between the second body region 103d and the guard ring region 103r. An outer end 151b of the Schottky electrode 151 on the side of the guard ring region contacts with a portion of the guard ring region 103r. In this embodiment, the Schottky electrode 151 on the side of the guard ring region corresponds to the side of the edge termination region 100E. An end 151a of the Schottky electrode 151 on the side of the transistor region 100T may contact with a portion of the second body region 103d that extends from the boundary region 100G. In this example, the Schottky electrode 151 is arranged across the second body region 103d and the guard ring region 103r.

An upper electrode 112S that functions as an anode is arranged on the Schottky electrode 151. The upper electrode 112S may simultaneously be formed of a same conductive layer as the upper wiring layer 112. The upper electrode 112S may be a portion of the upper wiring layer 112. The source electrode 109, the first electrode 109a, and the Schottky electrode 151 are connected together in parallel by the upper wiring layer 112.

In this embodiment, a portion of the second body region 103d and the first electrode 109a configure a diode cell 100d at an end of the transistor region 100T. An electrode structure of the diode cell 100d may be almost the same as the transistor cell 100u. However, the diode cell 100d does not have the source region 104 in the second body region 103d. Further, the diode cell 100d may not have the gate electrode 108. The first electrode 109a may form the ohmic junction with respect to the second body region 103d. The contact region 105 that is similar to the transistor cell 100u may be provided in the second body region 103d so that an ohmic contact is formed between the first electrode 109a and the second body region 103d.

Plural diode cells 100d may be arranged outside of the plural transistor cells 100u in the transistor region 100T. Here, the plural diode cells 100d are arrayed to surround a region in which the plural transistor cells 100u are formed when seen in the normal line direction of the main surface of the substrate 101. The diode cells 100d may be bonded to adjacent diode cells by the second body region 103d.

The semiconductor device 100 may have the edge termination region 100E outside of the transistor region 100T, the boundary region 100G, and the Schottky region 100S when seen in the normal line direction of the main surface of the substrate 101. The first silicon carbide semiconductor layer 102 is covered by the interlayer insulating film 111 in the edge termination region 100E. Further, plural second conductive type ring regions 103f may be formed at intervals on the surface of the first silicon carbide semiconductor layer 102 to surround the guard ring region 103r. The second conductive type ring region 103f may simultaneously be formed with the body region 103 in a similar process to the body region 103.

This embodiment enables provision of a transistor device with a built-in SBD without changing a design of a transistor cell. The SBD is connected with the MISFET in an anti-parallel manner, and the single chip may have both of the switching function of the MISFET and the function of the free-wheeling diode. Because the SBD that may function as the free-wheeling diode is built in, it is not necessary to separately arrange the free-wheeling diode when an inverter circuit or the like is configured. A circuit area may thus be reduced.

Further, as described in detail below, avalanche resistance may be enhanced compared to related art.

In the MISFET in related art, an avalanche current flows in a second conductive type region that is arranged in a more peripheral portion than the transistor region 100T. This results in a possibility that electrical breakdown occurs to a gate insulating film on the second conductive type region. On the other hand, in the semiconductor device 100, the SBD is arranged outside of (in a more peripheral portion than) the transistor region 100T when seen in the normal line direction of the main surface of the substrate 101. An outer end of the Schottky electrode 151 contacts with the guard ring region 103r. Accordingly, a portion of the avalanche current is made flow from the guard ring region 103r to the upper wiring layer 112 via the Schottky electrode 151. Accordingly, electrical breakdown in a portion of the gate insulating film that is positioned on the second conductive type region may be hindered. In this embodiment, electrical breakdown in a portion of the gate insulating film that is positioned on the second body region 103d may be hindered. Further, the SBD is arranged outside of (in a more peripheral portion than) the gate wiring layer 114 when seen in the normal line direction of the main surface of the substrate 101. Thus, electrical breakdown in a portion of the gate insulating film that is positioned below the gate wiring layer 114 may be hindered.

An end of the Schottky electrode 151 on the side of the transistor region 100T may contact with the second body region 103d. Accordingly, electric field concentration at an end of the Schottky electrode 151 is reduced, and device breakdown at the end of the Schottky electrode 151 may thereby be hindered. A portion of a charge-discharge current in the semiconductor device 100 is made flow to the upper wiring layer 112 via the Schottky electrode 151. Thus, breakdown of the gate insulating film may be hindered more effectively.

The semiconductor device 100 includes the gate wiring 114L and thus has the following advantages. In general, it is sufficient that a semiconductor device has a gate pad, and presence or absence of gate wiring depends on the size of the semiconductor device. The gate wiring is not formed in a relatively small semiconductor device. Gate electrodes of respective transistor cells are arranged in parallel, and all electric signals are sent from the gate pad to the gate electrode. In a case where no gate wiring is present, the gate electrodes of the transistor cell close to the gate pad receives the signal, and the gate electrode of the more distant transistor cell thereafter receives the signal. For example, in a case where the gate electrode is configured with poly-silicon with a higher resistance than metal wiring, such a signal delay becomes a problem. Thus, in a case where a gate signal is propagated only by the gate electrode, the signal delay occurs in accordance with the distance from the gate pad. As a result, a switching speed of the semiconductor device may decrease. On the other hand, the semiconductor device 100 of this embodiment has the gate wiring 114L that extends from the gate pad 114P. The gate wiring 114L is introduced, and the gate signal sent from the gate pad 114P thereby propagates on the side of the gate wiring 114L with a lower resistance than the gate electrode 108. Thus, the signal delay to the gate electrode 108 of the transistor cell 100u that is distant from the gate pad 114P may be reduced. For example, in a case where energization with a large current is necessary, the chip size of the semiconductor device 100 is increased. Increasing the chip size may reduce a delay of the gate signal as described above if the gate wiring 114L is formed. Accordingly, the gate wiring 114L is appropriately arranged, and the semiconductor device 100 with a large area may thereby be realized while the delay of the gate signal is reduced. In the semiconductor device 100 of this embodiment, the gate wiring 114L extends to a vicinity of the transistor cell that is the most distant from the gate pad 114P, and the signal delay may thus be reduced more effectively. The semiconductor device 100 is applicable to a use that needs a large current of 10 A or larger, for example.

In addition, at least a portion of the gate wiring layer 114 is arranged on the second body region 103d, and the gate wiring 114L may thus extends along a periphery of the transistor region 100T. Accordingly, breakdown of the gate insulating film that is positioned below the gate wiring 114L may be hindered while a high switching speed is secured.

A configuration of the transistor cell 100u is not limited to the above configuration. Although not illustrated, impurities of the first conductive type whose concentration is higher than the impurity concentration of the first silicon carbide semiconductor layer 102 may be introduced to at least a portion of a region of the surface of the first silicon carbide semiconductor layer 102 in which the body region 103 is not formed. This enables reduction in an electric resistance of the area of the surface of the first silicon carbide semiconductor layer 102 in which the body region 103 is not formed.

As described below, the Schottky region 100S may further have the second conductive type region (not illustrated) between the second body region 103d and the guard ring region 103r when seen in the normal line direction of the main surface of the substrate 101. The Schottky electrode 151 may be provided to contact with both of the drift region 102d of the first conductive type and the second conductive type region. This provides the Schottky-barrier diode that has a JBS structure.

An operation of the semiconductor device 100 will next be described. The semiconductor device 100 is a vertical three-terminal power device that has the gate wiring layer 114, the upper wiring layer 112, and the back surface electrode 113. The gate wiring layer 114 is connected with the gate electrode 108, the upper wiring layer 112 is connected with the source electrode 109 and the first electrode 109a, and the back surface electrode 113 is connected with the drain electrode 110. In the following description, the gate wiring layer, the upper wiring layer, and the back surface electrode are referred to as gate, source, and drain, respectively.

An ON state of the semiconductor device 100 will first be described. As described above, the semiconductor device 100 is the MISFET with a built-in SBD. It is assumed that a threshold voltage of the MISFET is Vth. The threshold voltage Vth has a positive value by appropriately selecting a concentration of the body region 103, a thickness of the gate insulating film 107, a material of the gate electrode 108, and so forth. For example, the source is set to 0 V, a voltage Vgs of the gate with respect to the source is set to Vth or higher, and a positive bias is applied to a voltage Vds of the drain with respect to the source. This makes the current flow from the drain toward the source in the plural transistor cells 100u in the transistor region 100T. In a case where Vds is positive in the diode cell 100d, a p-n junction that is formed between the second body region 103d of the second conductive type and the first silicon carbide semiconductor layer 102 of the first conductive type is in a reverse bias state, and thus the current does not flow. Further, in the Schottky region 100S, the Schottky junction that is formed between the Schottky electrode 151 and the first silicon carbide semiconductor layer 102 of the first conductive type is in the reverse bias state, and thus the current does not flow. That is, when the semiconductor device 100 is in the ON state, an ON-state current actually flows only in the transistor cells 100u.

An OFF state of the semiconductor device 100 will next be described. Even in a case where Vds is positive, when Vgs is set to a voltage lower than Vth, the current flowing in the transistor region 100T is blocked. Here, if Vds is increased, the respective p-n junctions that are formed between the body region 103 and the second body region 103d of the second conductive type and the drift region 102d of the first conductive type in the transistor region 100T and the boundary region 100G become the reverse bias state. Thus, a depletion layer spreads from a p-n junction interface, and the current is blocked even if Vds is in a high voltage state. Further, in the Schottky region 100S, the Schottky junction that is formed between the Schottky electrode 151 and the first silicon carbide semiconductor layer 102 of the first conductive type also becomes the reverse bias state. Thus, the depletion layer spreads from a Schottky junction interface, and the current is blocked even if Vds is in a high voltage state. The second body region 103d and the guard ring region 103r have a function of reducing electric field concentration at the ends 151a and 151b where the Schottky electrode 151 contacts with the first silicon carbide semiconductor layer 102. The second conductive type ring region 103f has a function of reducing electric field concentration in the guard ring region 103r.

A case where Vds is negative will next be described. For example, the source is set to 0 V, the voltage Vgs of the gate with respect to the source is set to lower than 0 V, and a negative bias is applied to the voltage Vds of the drain with respect to the source. Here, the respective p-n junctions that are formed between the body region 103 and the second body region 103d of the second conductive type and the drift region 102d of the first conductive type become a forward bias state. Further, the Schottky junction that is formed between the Schottky electrode 151 and the first silicon carbide semiconductor layer 102 of the first conductive type also becomes the forward bias state. In a case where 4H—SiC is selected as the first silicon carbide semiconductor layer 102, a p-n current starts flowing through the p-n junction when the forward bias of approximately 3 V is applied. Further, in a case where Ti is selected as the Schottky electrode, for example, a Schottky current starts flowing through the Schottky junction when the forward bias of approximately 0.8 V is applied. Accordingly, in a case where Vds is negative, |Vds| that does not make the p-n junction the ON state (for example, Vds=−1.5 V) is applied, and the Schottky current may thereby be made flow only in the Schottky region 100S.

As described above, the semiconductor device 100 of this embodiment functions as the MISFET in a case of Vds>0 and functions as the SBD in a case of Vds<0.

A manufacturing method of the semiconductor device 100 in this embodiment will next be described. FIGS. 4A to 12B are process cross-sectional views for explaining a manufacturing method of the semiconductor device 100 and illustrate cross-sectional structures taken along line 3A-3A in FIG. 2A.

The substrate 101 is first prepared. The substrate 101 is an n-type 4H—SiC off-cut substrate with a low resistance whose resistivity is approximately 0.02 Ωcm, for example.

Figure 4A:
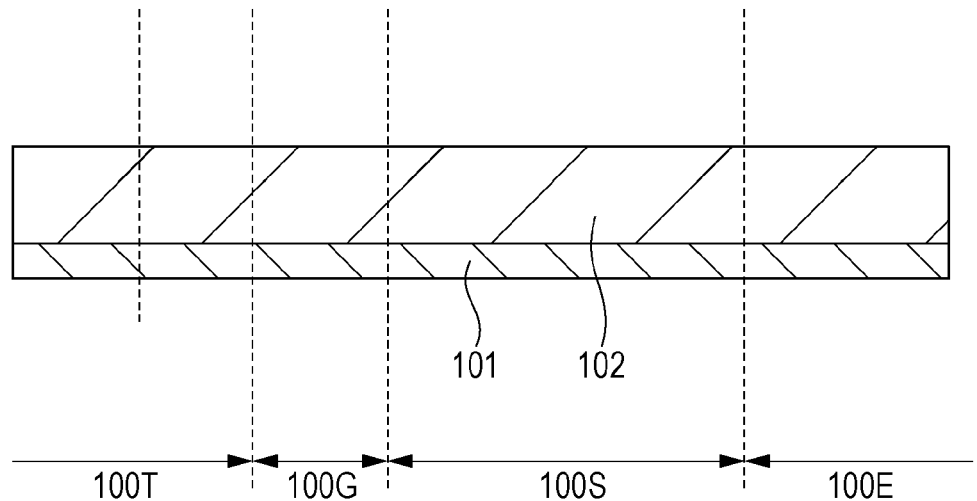
FIGS. 4A and 4B are process cross-sectional views for explaining one example of a manufacturing method of the semiconductor device.

As illustrated in FIG. 4A, the first silicon carbide semiconductor layer 102 of the n-type and with a high resistance is formed on the substrate 101 by epitaxial growth. Before the first silicon carbide semiconductor layer 102 is formed, a buffer layer that is configured with SiC of the n-type and at a high impurity concentration may be deposited on the substrate 101. The impurity concentration of the buffer layer is $1 \times 10^{18}$ cm$^{-3}$, for example, and the thickness of the buffer layer is 1 μm, for example. The first silicon carbide semiconductor layer 102 is configured with n-type 4H—SiC, for example. The impurity concentration and the thickness thereof are $1 \times 10^{16}$ cm$^{-3}$ and 10 μm, respectively, for example.

Figure 4B:
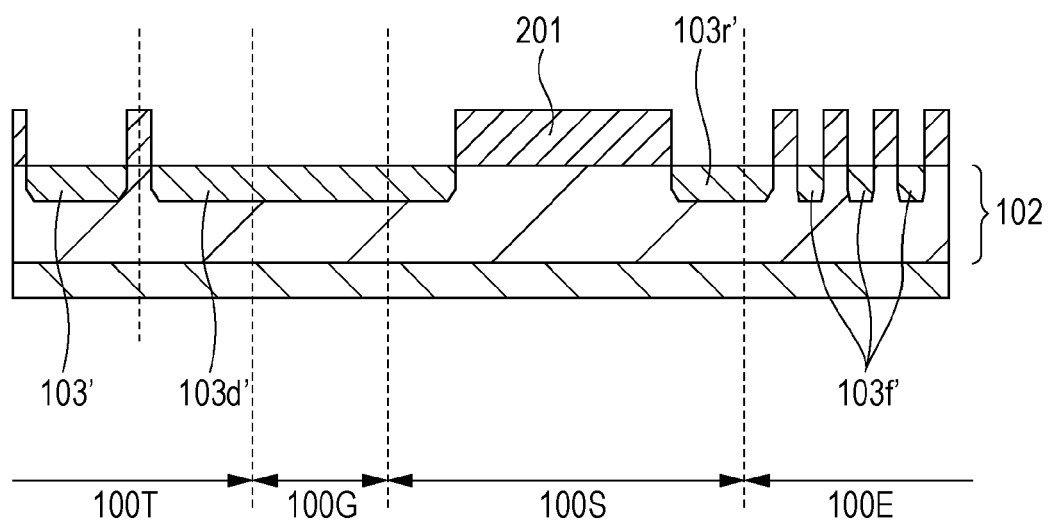

As illustrated in FIG. 4B, a mask 201 that is formed of SiO$_2$, for example, is formed on the first silicon carbide semiconductor layer 102. For example, aluminum (Al) ions are implanted in the first silicon carbide semiconductor layer 102. A body implantation region 103', a second body implantation region 103d', a guard ring implantation region 103r', and a ring implantation region 103f' that demarcate the transistor cell are thereby formed simultaneously. For example, the concentration of implanted Al ions is approximately $2 \times 10^{17}$ cm$^{-3}$, and energy and dose amount of ion implantation are adjusted so that the depth of the implanted Al ions becomes approximately 0.5 to 1.0 μm. The depth here corresponds to the distance from the surface of the first silicon carbide semiconductor layer 102 to the position where the concentration of the implanted Al ions becomes equivalent to the n-type impurity concentration of the first silicon carbide semiconductor layer 102. The depth profile of the impurity concentration in a perpendicular direction to the main surface of the substrate 101 is the same for the body implantation region 103', the second body implantation region 103d', the guard ring implantation region 103r', and the ring implantation region 103f'.

As illustrated in FIG. 5A, after the ion implantation, the mask 201 is removed, and a mask 202 that is formed of SiO$_2$, for example, is next formed. For example, ion implantation of nitrogen is performed in the body implantation region 103' that demarcates the transistor cell 100u by using the mask 202 to form a source implantation region 104'. An ion implantation profile is adjusted so that the depth of the source implantation region 104' becomes 250 nm, for example, and an average impurity concentration becomes approximately $5 \times 10^{19}$ cm$^{-3}$. The mask 202 is removed after the ion implantation.

SiO$_2$ or the like is further deposited and is partially processed while a portion of the mask 201 remains, and a side wall may thereby formed as a mask on a lateral wall of the mask 201. In this case, the mask 201 and the side wall may be used as the mask 202. That is, a so-called self-aligning process in which the source implantation region 104' is formed with respect to the body implantation region 103' in a self-aligned manner may be applied.

As illustrated in FIG. 5B, after a mask 203 is formed, Al is next implanted in the first silicon carbide semiconductor layer 102, thereby forming a contact implantation region 105'. The contact implantation region 105' is arranged in the body implantation region 103' to contact with the body implantation region 103'. The depth of the contact implantation region 105' is 400 nm, for example, and the average impurity concentration is approximately $1 \times 10^{20}$ cm$^{-3}$. The depth of the contact implantation region 105' is set so that an impurity concentration of $5 \times 10^{17}$ cm$^{-3}$ is obtained, for example. The mask 203 is thereafter removed.

Here, when seen in the normal line direction of the main surface of the substrate 101, a region in each of the transistor cells 100u in the transistor region 100T where any of the body implantation region 103', the source implantation region 104', and the contact implantation region 105' of the first silicon carbide semiconductor layer 102 is not formed is referred to as a JFET region 102j. An implantation region (not illustrated) of the first conductive type may be formed to surround the JFET region 102j when the JFET region 102j is seen in the normal line direction of the main surface of the substrate 101. This implantation region is formed by ion implantation of N, for example. This implantation region may be formed from the surface of the first silicon carbide semiconductor layer 102 to a deeper position than the body implantation region 103' with respect to the perpendicular direction to the substrate 101. The average impurity concentration of this implantation region is set to approximately $1 \times 10^{17}$ cm$^{-3}$, for example.

After those kinds of ion implantation, a high-temperature heat treatment (activation annealing) that activates the impurities that are implanted in the first silicon carbide semiconductor layer 102 is performed. As illustrated in FIG. 6A, the body region 103, the second body region 103d, the guard ring region 103r, the second conductive type ring region 103f, the source region 104, and the contact region 105 are thereby obtained. The activation annealing may be realized by depositing a carbon film of approximately 200 nm on the first silicon carbide semiconductor layer 102 and performing a heat treatment at approximately 1700° C. for approximately 30 minutes in an atmosphere of inactive gas such as Ar or N$_2$ or in a vacuum, for example.

An outer layer of the first silicon carbide semiconductor layer 102 may be removed to clean the surface of the first silicon carbide semiconductor layer 102 after the activation annealing. For example, in a case where the outer layer of the first silicon carbide semiconductor layer 102 is removed by 50 nm, all the depths of the body region 103, the second body region 103d, the guard ring region 103r, the second conductive type ring region 103f, the source region 104, and the contact region 105 are reduced by approximately 50 nm. Here, a step of removing a thermal oxide film after thermal oxidation (sacrificial oxidation step), for example, and a step of forming a gate oxide film that will be described below are performed. The surface of the first silicon carbide semiconductor layer 102 is thereby removed by approximately 50 nm.

As illustrated in FIG. 6B, the gate insulating film 107 and the gate electrode 108 are next formed. Here, the thermal oxidation step is performed after a surface portion of the first silicon carbide semiconductor layer 102 is removed by the sacrificial oxidation, thereby forming the gate insulating film 107 on the surface of the first silicon carbide semiconductor layer 102. A polycrystalline silicon film that is doped with phosphorus of approximately $7 \times 10^{20}$ cm$^{-3}$, for example, is thereafter deposited on the gate insulating film 107 as a gate electrode conductive film. The thickness of the polycrystalline silicon film is approximately 500 nm, for example. Dry etching is next performed on the polycrystalline silicon film by using a mask (not illustrated), thereby forming the gate electrode 108 and the gate connection section 108g in desired areas.

Figure 7A:
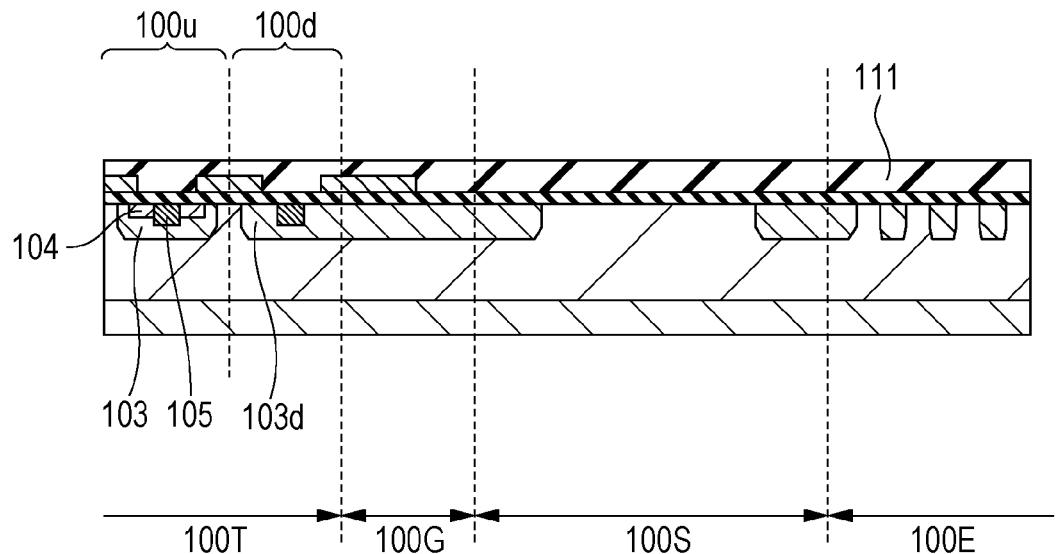
FIGS. 7A and 7B are process cross-sectional views for explaining one example of the manufacturing method of the semiconductor device.

As illustrated in FIG. 7A, the interlayer insulating film 111 that uses SiO$_2$, for example, is next deposited by a CVD method to cover a surface of the gate electrode 108, a surface of the gate connection section 108g, and the surface of the first silicon carbide semiconductor layer 102. The thickness of the interlayer insulating film 111 is 1 µm, for example.

Figure 7B:
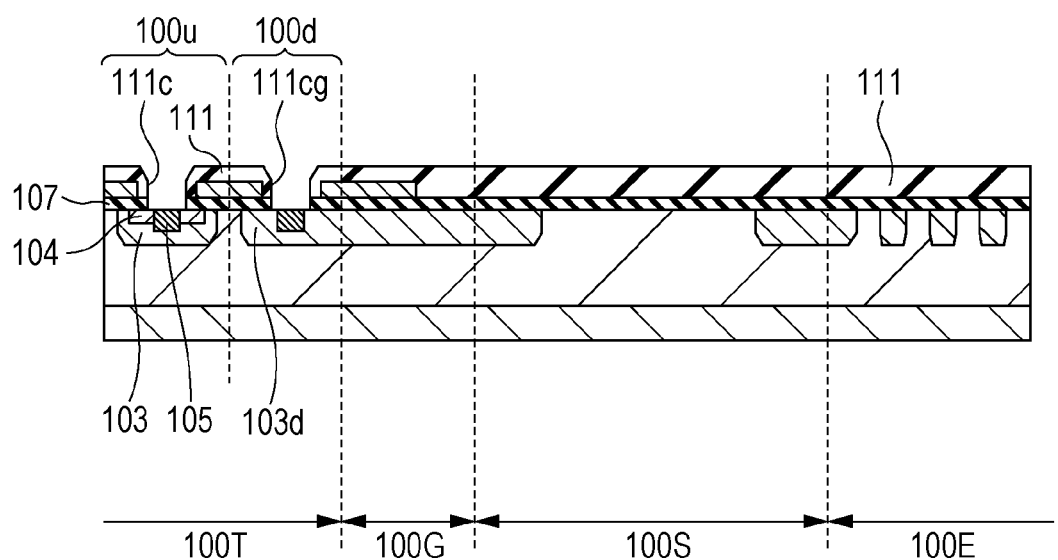

As illustrated in FIG. 7B, the interlayer insulating film 111 and the gate insulating film 107 that are present on a surface of the contact region 105 and a portion of a surface of the source region 104 are removed by dry etching and by using a mask formed of a photoresist (not illustrated). Accordingly, a source contact hole 111c that exposes the source region 104 and the contact region 105 of each of the transistor cells and a body contact hole 111cg that exposes the contact region 105 of each of the diode cells are formed in the interlayer insulating film 111 and the gate insulating film 107.

Figure 8A:
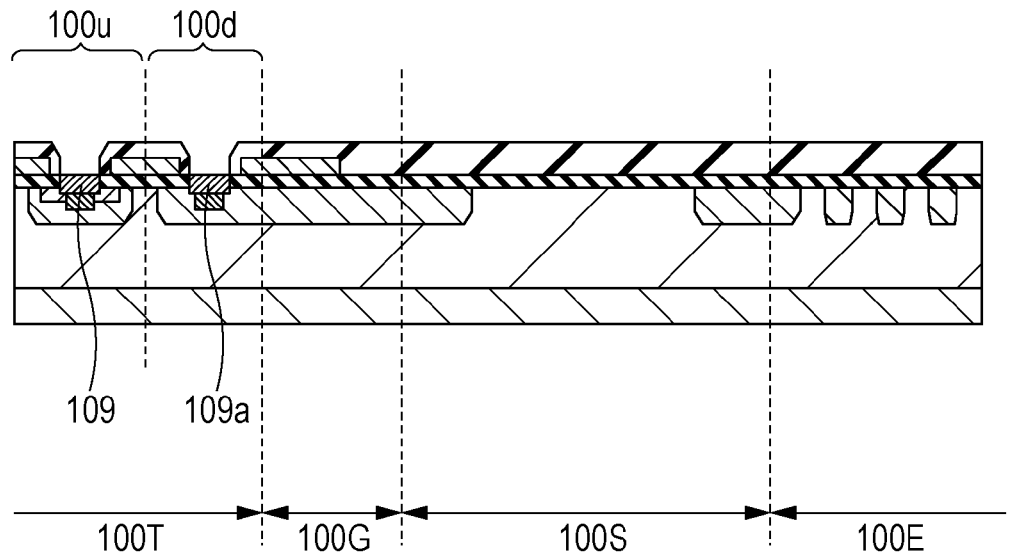
FIGS. 8A and 8B are process cross-sectional views for explaining one example of the manufacturing method of the semiconductor device.
Figure 8B:
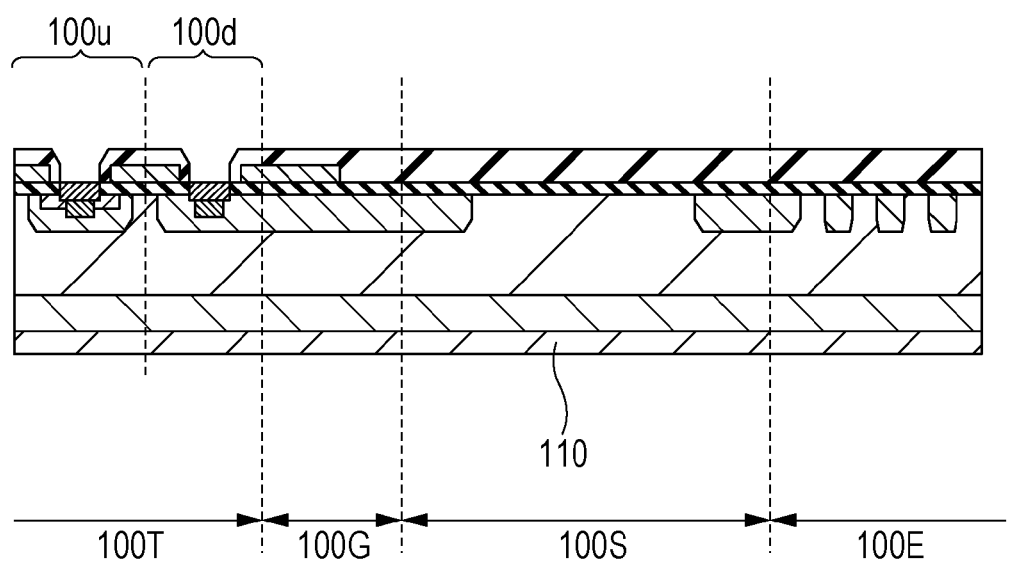

As illustrated in FIG. 8A, the source electrode 109 and the first electrode 109a are thereafter formed in the source contact hole 111c and the body contact hole 111cg, respectively. Here, Ni films in a thickness of approximately 100 nm, for example, are formed on the interlayer insulating film 111 and in the source contact hole 111c and the body contact hole 111cg as a source electrode conductive film. A heat treatment for 1 minute is next performed at 950° C., for example, in an inactive atmosphere. This makes the Ni films react with the first silicon carbide semiconductor layer 102 and provides the source electrode 109 and the first electrode 109a that are configured with Ni silicide. The Ni film on the interlayer insulating film 111 is next removed by etching.

The drain electrode 110 is next formed on the back surface of the substrate 101. Here, the back surface of the substrate 101 is made react with the Ni film by depositing the Ni film on the whole back surface of the substrate 101, for example, and by performing a heat treatment similar to the above, thereby forming the drain electrode 110 that is formed of Ni silicide.

Figure 9A:
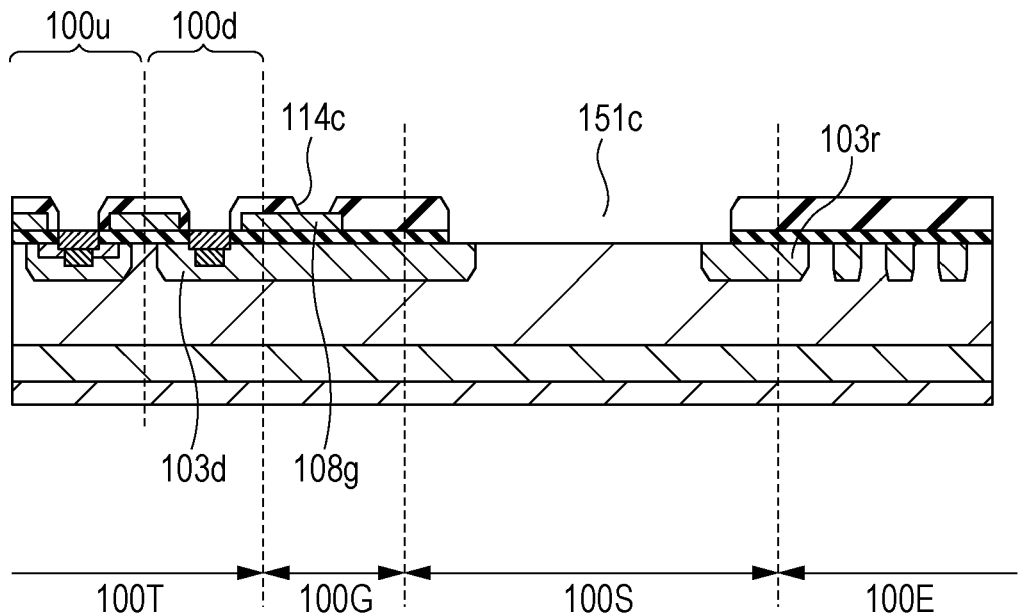
FIGS. 9A and 9B are process cross-sectional views for explaining one example of the manufacturing method of the semiconductor device.

Next, as illustrated in FIG. 9A, the mask formed of the photoresist (not illustrated) is formed, and a portion of the interlayer insulating film 111 and a portion of the gate insulating film 107 are thereafter etched to expose the gate connection section 108g in the boundary region 100G, the drift region 102d in the Schottky region 100S, and a portion of the guard ring region 103r. A gate contact hole 114c and the Schottky contact hole 151c are thereby formed.

Figure 9B:
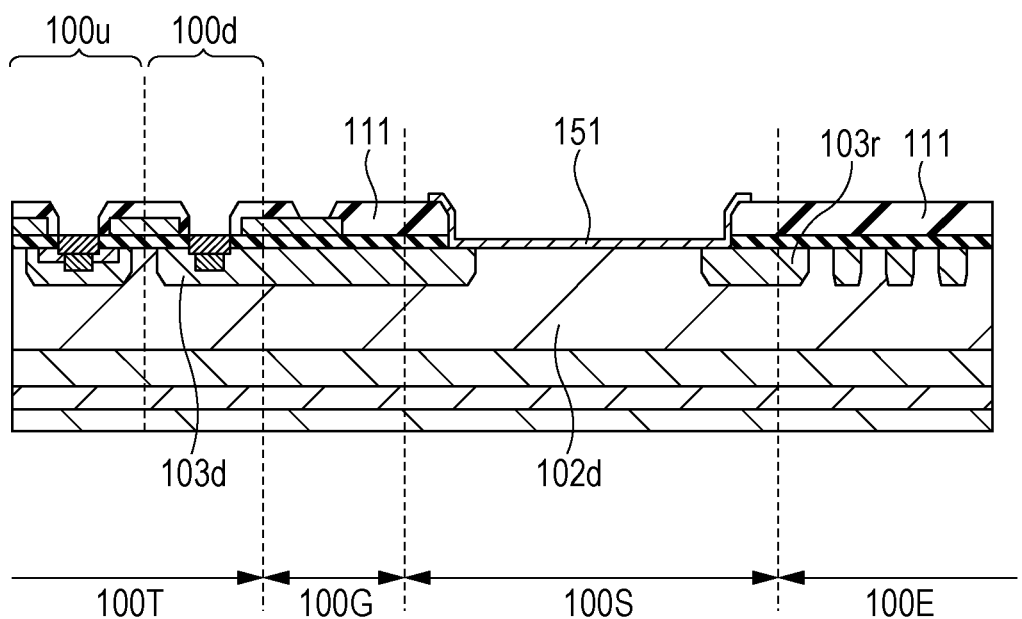

As illustrated in FIG. 9B, the Schottky electrode 151 is next formed in the Schottky contact hole 151c. Here, the photoresist is first coated onto the surface that has the interlayer insulating film 111, and a resist opening that is slightly wider than the Schottky contact hole 151c is formed in the Schottky region 100S. The surface of the first silicon carbide semiconductor layer 102 that is exposed by the resist opening is next cleaned by buffered hydrofluoric acid or the like. After the cleaning, a Ti film (thickness: 200 nm, for example) to become the Schottky electrode is formed from a position above the resist opening. A portion of the Ti film that is positioned on a resist is thereafter removed by using a lift-off process. Accordingly, the Schottky electrode 151 is formed in the Schottky contact hole 151c. The Schottky electrode 151 contacts with the second body region 103d, the guard ring region 103r, and the drift region 102d that is positioned between the second body region 103d and the guard ring region 103r. In this example, ends of the Schottky electrode 151 are on the interlayer insulating film 111. However, the ends of the Schottky electrode 151 may be on the second body region 103d and the guard ring region 103r.

Figure 10A:
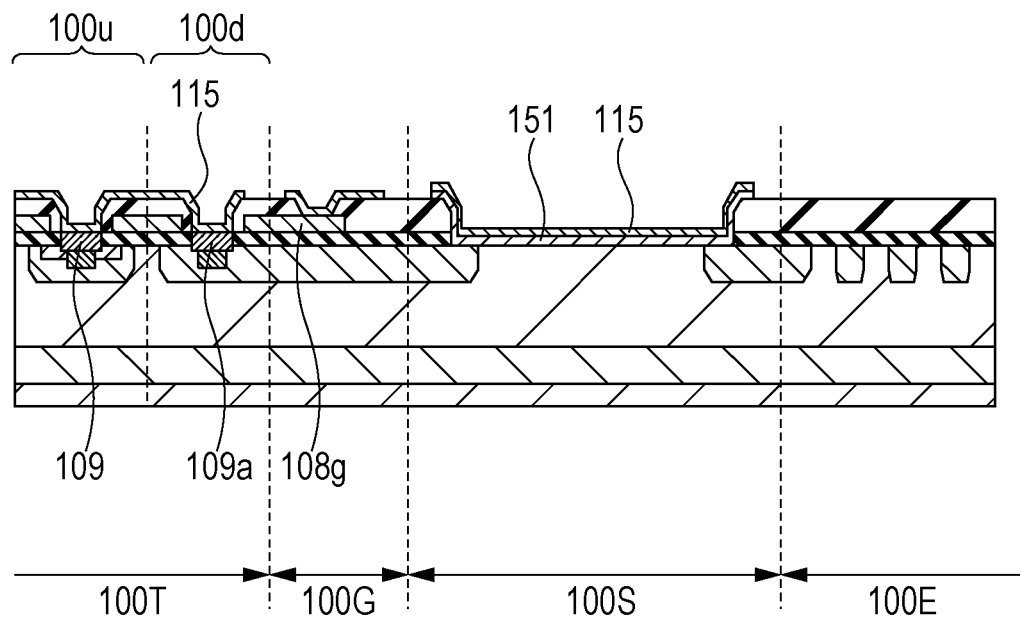
FIGS. 10A and 10B are process cross-sectional views for explaining one example of the manufacturing method of the semiconductor device.

As illustrated in FIG. 10A, the barrier metal layer (a laminated film that contains Ti and TiN, for example) 115 is formed to cover the source electrode 109, the gate connection section 108g, and the Schottky electrode 151 in the source contact hole 111c, the gate contact hole 114c, and the Schottky contact hole 151c, respectively. Here, a laminated film that has Ti as a lower layer and TiN as a higher layer, for example, is first deposited on the interlayer insulating film 111 and in the source contact hole 111c, the gate contact hole 114c, and the Schottky contact hole 151c. Here, a Ti film as the lower layer is arranged to contact with the source electrode 109, the gate connection section 108g, and the Schottky electrode 151. The mask formed of the photoresist (not illustrated) is next formed, and etching of the laminated film is performed. The barrier metal layers 115 are thereby formed in desired positions. The thickness of the Ti film is 20 nm, for example, and the thickness of the TiN film is 40 nm, for example, in the barrier metal layer 115.

Figure 10B:
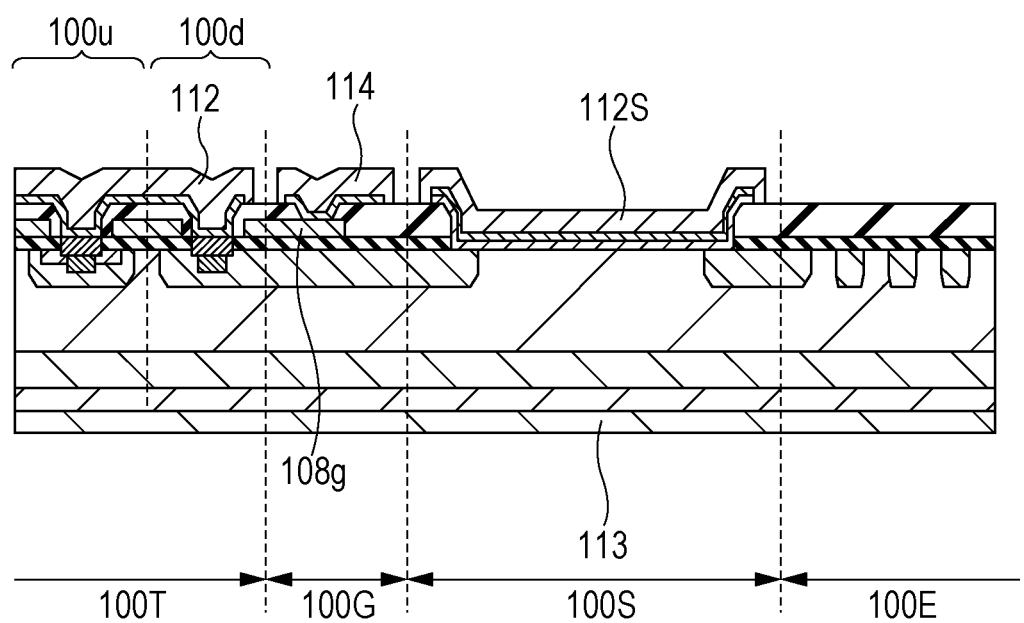

As illustrated in FIG. 10B, the upper wiring layer 112 and the gate wiring layer 114 are next formed. Here, an aluminum film (thickness: 4 µm, for example) is deposited on the barrier metal layer 115 and the interlayer insulating film 111 as a wiring metal film and is etched in a desired pattern. This provides the upper wiring layer 112 that contacts with the source electrode 109 and the first electrode 109a. The gate wiring layer 114 that contacts with the gate connection section 108g and the upper electrode 112S that contacts with the Schottky electrode 151 are simultaneously formed. The upper electrode 112S may integrally be formed with the upper wiring layer 112.

In addition, the back surface electrode 113 for die-boding is formed on a back surface of the drain electrode 110. Here, for example, the Ti film, the Ni film, and an Ag film are deposited in this order to obtain the back surface electrode 113 that is formed of a laminated film of Ti/Ni/Ag. The thicknesses of the Ti film, the Ni film, and the Ag film are 0.1 µm, 0.3 µm, and 0.7 µm, respectively, for example. The semiconductor device 100 is manufactured as described above.

Although not particularly illustrated, a passivation film may be deposited on the interlayer insulating film 111, the gate wiring layer 114, the upper wiring layer 112, and the upper electrode 112S, and openings that expose a portion of the upper wiring layer 112 and a portion of the gate pad 114P may be formed in the passivation film.

Modification Example 1-1

A modification example of the semiconductor device of this embodiment will be described with reference to FIGS. 11A and 11B.

Figure 11A:
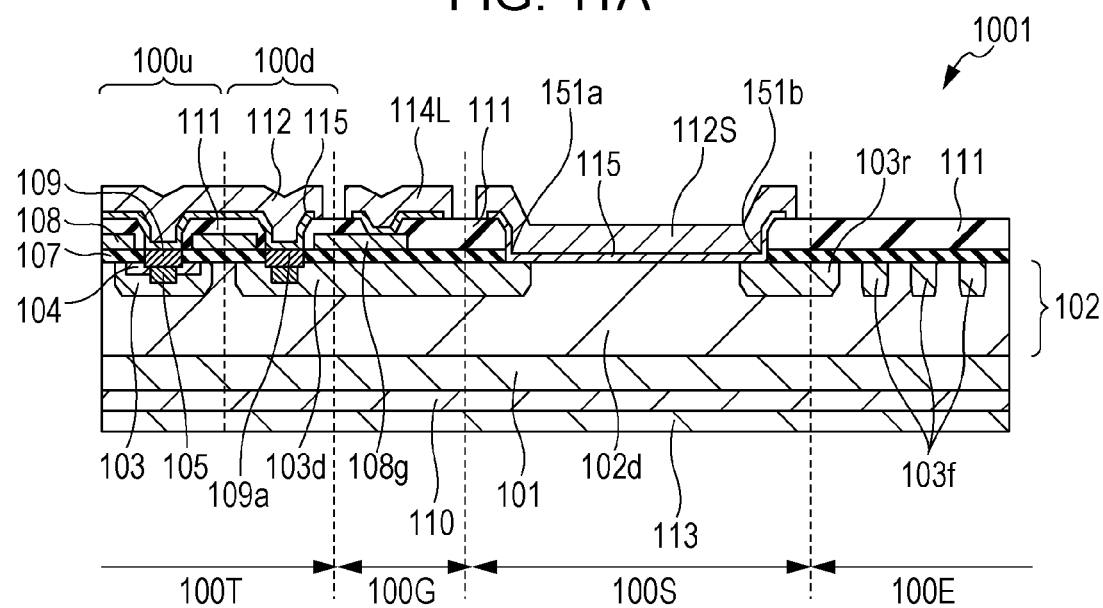
FIGS. 11A and 11B are cross-sectional views taken along line 3A-3A and line 3B-3B of a semiconductor device as a modification example of the first embodiment.
Figure 11B:
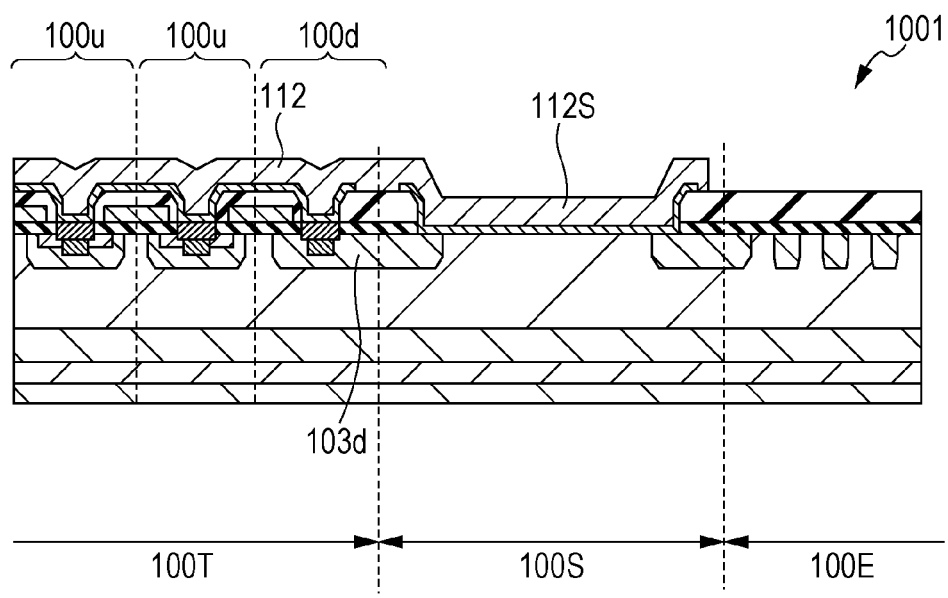

FIGS. 11A and 11B are cross-sectional views taken along line 3A-3A and line 3B-3B of a semiconductor device 1001 as a modification example. A top view of the semiconductor device 1001 is similar to the top views of the semiconductor device 100 illustrated in FIGS. 2A and 2B and is thus not provided. Line 3A-3A and line 3B-3B of the semiconductor device 1001 correspond to line 3A-3A and line 3B-3B indicated in FIG. 2A.

The semiconductor device 1001 is different from the semiconductor device 100 in a point that a portion of the barrier metal layer 115 that is formed in the Schottky region 100S functions as the Schottky electrode. As described above, the barrier metal layer 115 may have a laminated structure that contains the Ti film and the TiN film. The Ti film of the barrier metal layer 115 may have a structure in which the Ti film directly contacts with the first silicon carbide semiconductor layer 102 in the Schottky region 100S. In order to make the barrier metal layer 115 also function as the Schottky electrode, the thickness of the Ti film in the barrier metal layer 115 may be increased from 100 to 200 nm, for example.

One example of a manufacturing method of the semiconductor device 1001 will next be described with reference to FIGS. 12A and 12B. Here, only steps that are different from the manufacturing method of the semiconductor device 100 that is illustrated in FIGS. 4A to 10B will be described, and similar steps will be not be described.

Figure 12A:
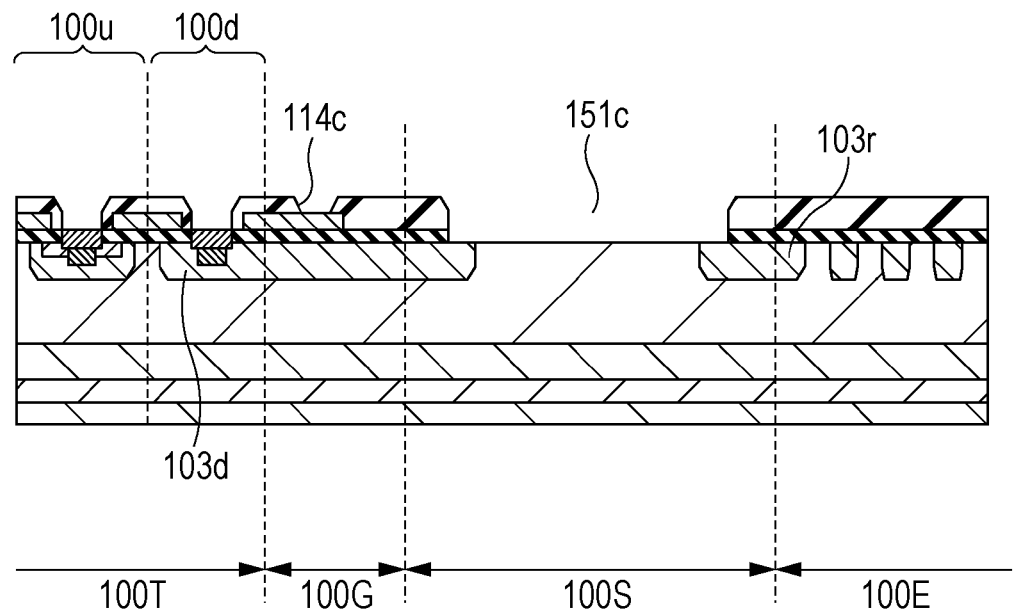
FIGS. 12A and 12B are process cross-sectional views for explaining one example of a manufacturing method of the semiconductor device.

As illustrated in FIG. 12A, steps to formation of the interlayer insulating film 111 are first performed in a similar method to the method that is described above with reference to FIGS. 4A to 9A.

Figure 12B:
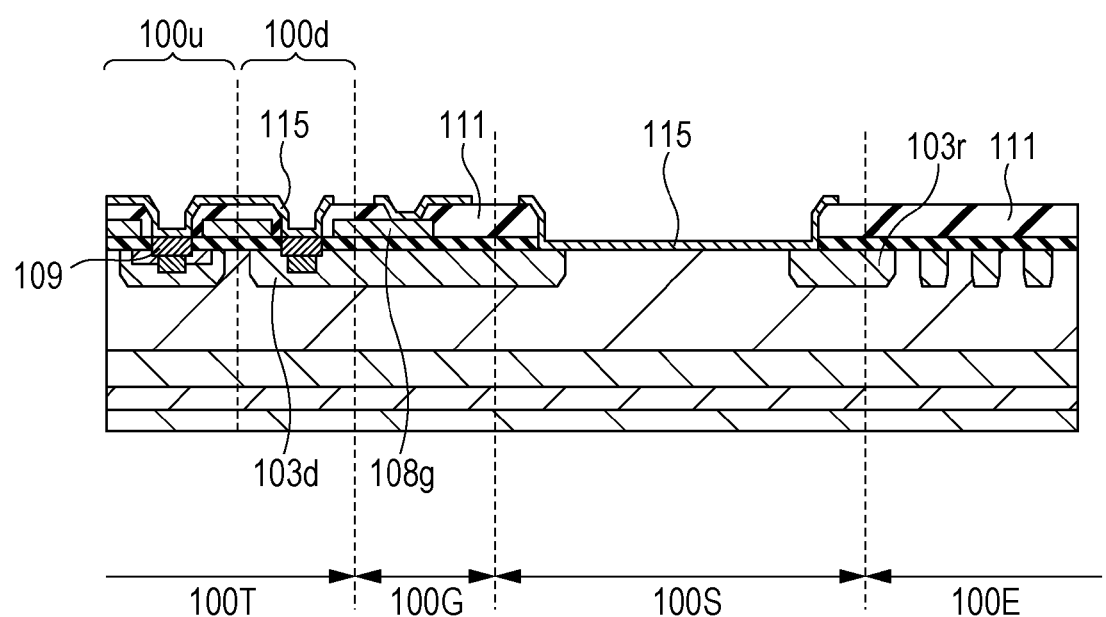

As illustrated in FIG. 12B, the barrier metal layer 115 is next formed. Here, the surface of the first silicon carbide semiconductor layer 102 that is exposed by the Schottky contact hole 151c is first cleaned by dilute hydrofluoric acid or the like. A laminated film is thereafter formed by depositing the Ti film and the TiN film, for example, in this order on the interlayer insulating film 111 and in the source contact hole 111c, the body contact hole 111cg, the gate contact hole 114c, and the Schottky contact hole 151c. The Ti film is arranged to contact with the source electrode 109, the gate connection section 108g, and the first silicon carbide semiconductor layer 102. The mask formed of the photoresist (not illustrated) is formed on the laminated film, and etching of the laminated film is performed. The barrier metal layers 115 are thereby formed in desired positions. In this example, the barrier metal layers 115 cover the source electrode 109, the gate connection section 108g, and the first silicon carbide semiconductor layer 102 in the source contact hole 111c, the body contact hole 111cg, the gate contact hole 114c, and the Schottky contact hole 151c. Further, in the Schottky region 100S, the barrier metal layer 115 contacts with a portion of the second body region 103d, a portion of the guard ring region 103r, and a region of the first conductive type of the first silicon carbide semiconductor layer 102 that is positioned between the second body region 103d and the guard ring region 103r. The thickness of the Ti film is 200 nm, for example, and the thickness of the TiN film is 40 nm, for example, in the barrier metal layer 115.

Although not illustrated, the upper wiring layer 112, the gate wiring layer 114, the upper electrode 112S, and the back surface electrode 113 are thereafter formed by a similar method to the method that is described above with reference to FIG. 10B. The semiconductor device 1001 is obtained as described above.

In the semiconductor device 1001, a portion of the barrier metal layer 115 also provides the function of the Schottky electrode. This enables omission of a step of individually forming the Schottky electrode 151 (FIG. 9B) and thus enables reduction in a manufacturing cost by process simplification.

Modification Example 1-2

Another modification example of the semiconductor device of this embodiment will be described with reference to FIGS. 13A and 13B.

Figure 13A:
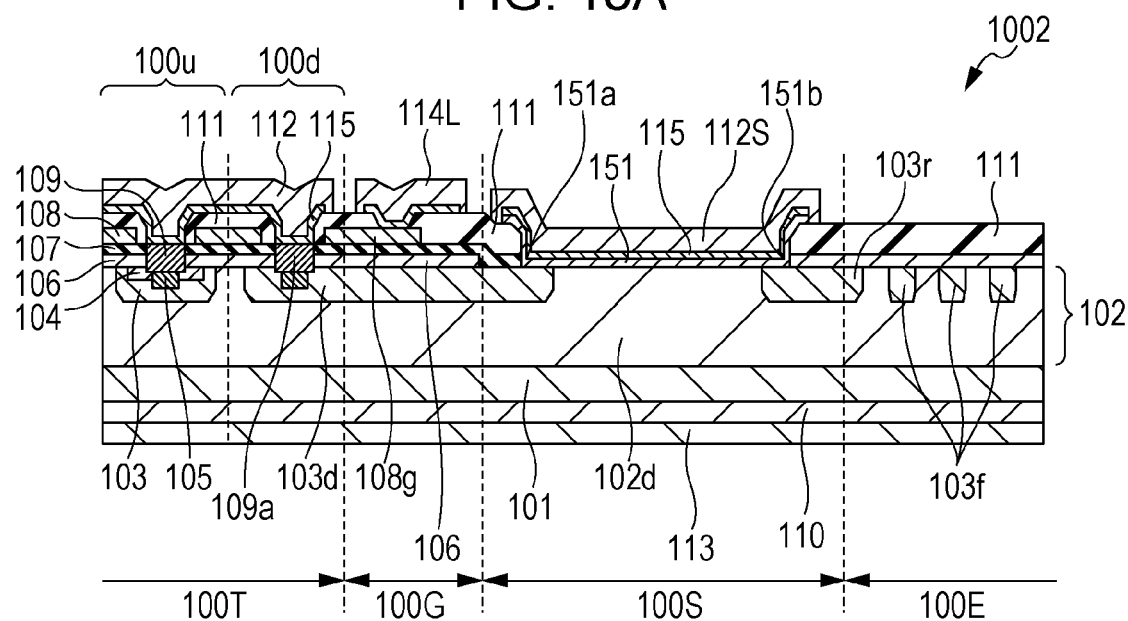
FIGS. 13A and 13B are cross-sectional views taken along line 3A-3A and line 3B-3B of a semiconductor device as another modification example of the first embodiment.
Figure 13B:
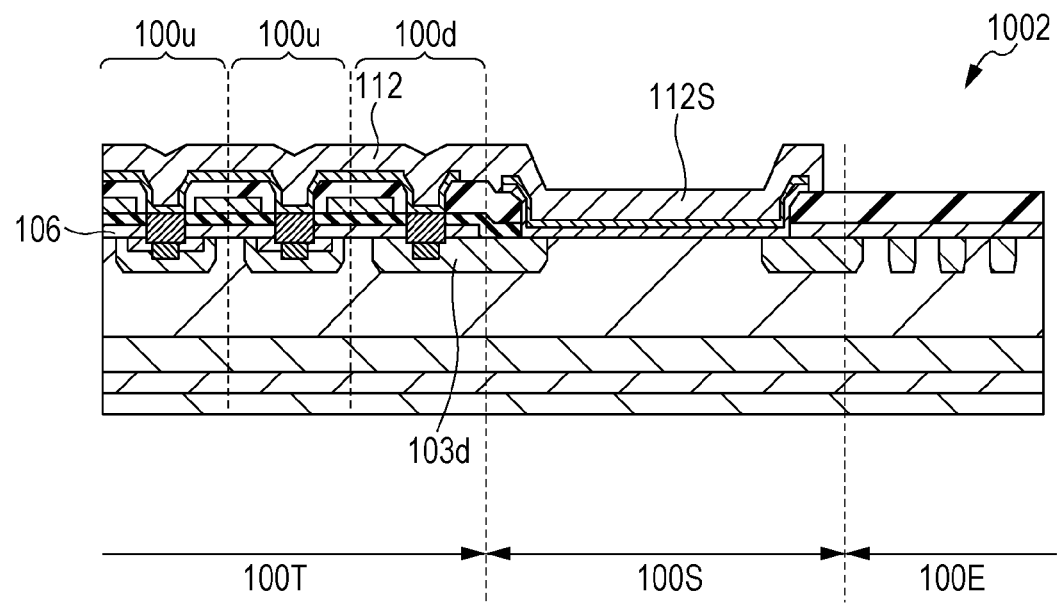

FIGS. 13A and 13B are cross-sectional views taken along line 3A-3A and line 3B-3B of a semiconductor device 1002 as a modification example. A top view of the semiconductor device 1002 is similar to the top views of the semiconductor device 100 illustrated in FIGS. 2A and 2B and is thus not provided. Line 3A-3A and line 3B-3B of the semiconductor device 1002 correspond to line 3A-3A and line 3B-3B indicated in FIG. 2A.

The semiconductor device 1002 is different from the semiconductor device 100 in a point of further having a second silicon carbide semiconductor layer 106 of the first conductive type. The second silicon carbide semiconductor layer 106 is formed between the gate insulating film 107 and the body region 103 in each of the transistor cells 100u. The second silicon carbide semiconductor layer 106 is also referred to as channel layer. A channel resistance of each of the transistor cells 100u is reduced by introducing the second silicon carbide semiconductor layer 106. The second silicon carbide semiconductor layer 106 may be formed by epitaxial growth. This enhances crystallinity of a channel section compared to a configuration in which a channel is formed on a surface of the body region 103 formed by ion implantation and thus enables reduction in the channel resistance of a transistor.

In a case where the first conductive type is the n-type, the threshold voltage of the transistor is decreased by introducing the second silicon carbide semiconductor layer 106 of the n-type. Thus, the impurity concentration of the body region 103 may be adjusted to set a threshold value to a desired value. For example, in a case where the impurity concentration of the second silicon carbide semiconductor layer 106 is approximately $7 \times 10^{17}$ cm$^{-3}$ and the thickness is approximately 50 nm, the impurity concentration of the body region 103 of the p-type is set to approximately $2 \times 10^{18}$ cm$^{-3}$, for example.

The second silicon carbide semiconductor layer 106 may be formed not only in the transistor region 100T but also in at least a portion of the boundary region 100G. The second silicon carbide semiconductor layer 106 may not be present in the Schottky region 100S and the edge termination region 100E.

In the transistor cell 100u, the second silicon carbide semiconductor layer 106 is formed on the body region 103. In this modification example, the second silicon carbide semiconductor layer 106 is also formed on the source region 104. For example, after the second silicon carbide semiconductor layer 106 is formed, a source implantation region is formed to include a portion of the second silicon carbide semiconductor layer 106 and a portion of the body region 103 and is activated, and the source region 104 may be thereby formed directly in the second silicon carbide semiconductor layer 106. The gate insulating film 107 is formed on the second silicon carbide semiconductor layer 106. The second silicon carbide semiconductor layer 106 functions as the channel layer in the transistor cell 100u.

A manufacturing method of the semiconductor device 1002 will next be described. Here, only steps that are different from the manufacturing method of the semiconductor device 100 that is illustrated in FIGS. 4A to 10B will be described, and similar steps will not be described.

The body region 103, the source region 104, and so forth are first formed in the first silicon carbide semiconductor layer 102 in a similar method to the method that is described above with reference to FIGS. 4A to 6A. However, as described above, the concentration of the body region 103 is adjusted. Here, the concentration of the body region 103 is set to $2 \times 10^{18}$ cm$^{-3}$, for example.

After the high-temperature heat treatment (activation annealing) is performed, a second silicon carbide semiconductor film of the n-type is formed on the first silicon carbide semiconductor layer 102 by epitaxial growth, for example. Here, the impurity concentration of the second silicon carbide semiconductor film is set to approximately $7 \times 10^{17}$ cm$^{-3}$, for example, and the thickness is set to approximately 100 nm, for example.

As illustrated in FIGS. 13A and 13B, a portion of the second silicon carbide semiconductor film is removed by etching, and the second silicon carbide semiconductor layer 106 is thereby obtained. In this example, the second silicon carbide semiconductor film that is formed in the Schottky region 100S and the edge termination region 100E are removed, for example. The second silicon carbide semiconductor layer 106 is thereby formed at least in portions of the transistor region 100T and the boundary region 100G.

The so-called sacrificial oxidation step is next performed in which a surface of the second silicon carbide semiconductor layer 106 and a portion of the surface of the first silicon carbide semiconductor layer 102 that is not covered by the second silicon carbide semiconductor layer 106 are oxidized and obtained oxide films are removed. Next, the surfaces of the first and second silicon carbide semiconductor layers are cleaned and thereafter further oxidized, and the gate insulating film 107 is thereby formed at least on the second silicon carbide semiconductor layer 106. The thickness of the second silicon carbide semiconductor layer 106 is adjusted to 50 nm, for example, through the sacrificial oxidation step and a gate oxidation step.

Subsequent steps are similar to steps that are described above with reference to FIGS. 6B to 10B. When the source contact hole 111c is formed in the interlayer insulating film 111 and the gate insulating film 107, the second silicon carbide semiconductor layer 106 that is exposed by the source contact hole 111c may be removed by etching, or a portion or the whole thereof may remain. However, in a case where at least a portion of the second silicon carbide semiconductor layer 106 remains in the source contact hole 111c, in a step of forming the source electrode 109 by a silicidation reaction of a metal electrode, the thickness of the metal electrode, the temperature and time of the silicidation reaction, and so forth may be adjusted so that the source electrode 109 is electrically connected with the source region 104 and the contact region 105 and the source electrode 109 and the source region 104 form the ohmic contact. The source electrode 109 may also form the ohmic junction with the contact region 105.

Modification Example 1-3

Still another modification example of the semiconductor device of this embodiment will be described with reference to FIGS. 14A and 14B.

Figure 14A:
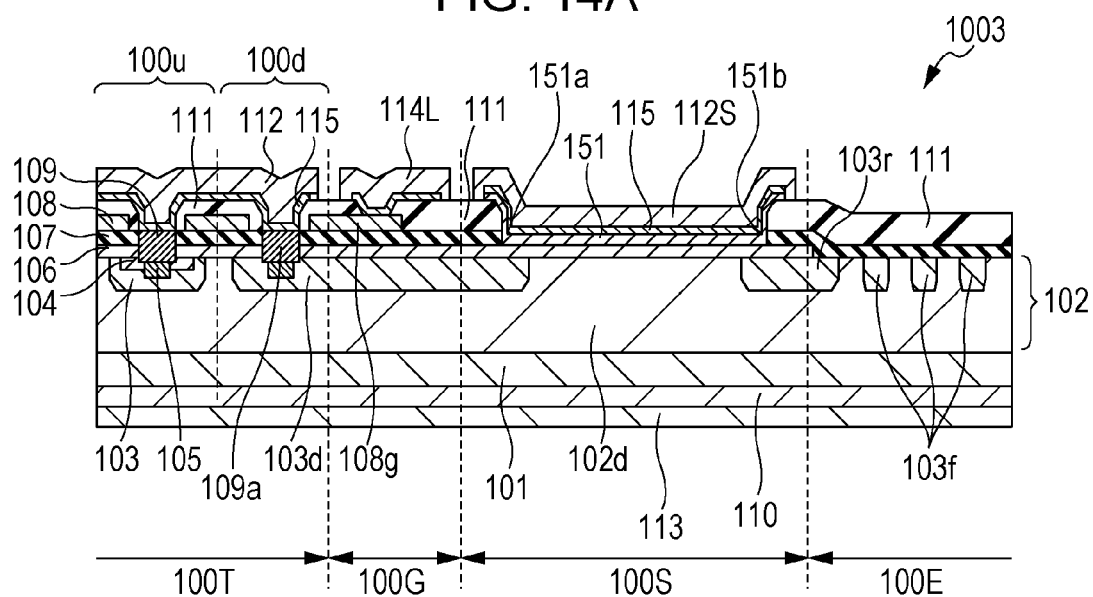
FIGS. 14A and 14B are cross-sectional views taken along line 3A-3A and line 3B-3B of a semiconductor device as still another modification example of the first embodiment.
Figure 14B:
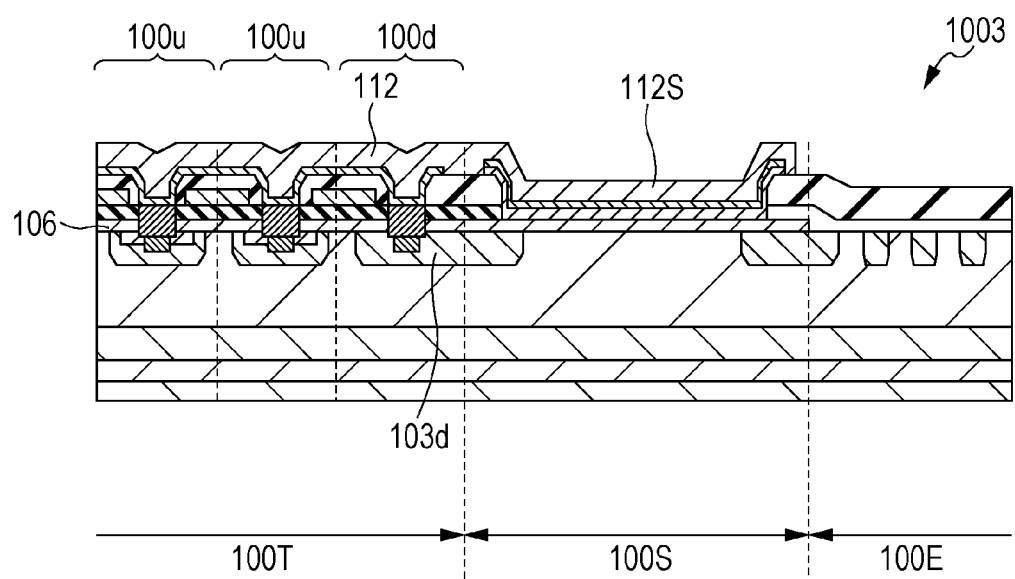

FIGS. 14A and 14B are cross-sectional views taken along line 3A-3A and line 3B-3B of a semiconductor device 1003 as a modification example. A top view of the semiconductor device 1003 is similar to the top views of the semiconductor device 100 illustrated in FIGS. 2A and 2B and is thus not provided. Line 3A-3A and line 3B-3B of the semiconductor device 1003 correspond to line 3A-3A and line 3B-3B indicated in FIG. 2A.

The semiconductor device 1003 is different from the semiconductor device 1002 of the modification example 1-2 in a point that the second silicon carbide semiconductor layer 106 of the first conductive type extends to the Schottky region 100S.

A manufacturing method of the semiconductor device 1003 is almost the same as the manufacturing method of the semiconductor device 1002 of the modification example 1-2, and a detailed description will not be made.

In this modification example, after the second silicon carbide semiconductor film is formed on the first silicon carbide semiconductor layer 102, the second silicon carbide semiconductor layer 106 is formed not only in the transistor region 100T and the boundary region 100G but also in the Schottky region 100S by patterning the second silicon carbide semiconductor film.

Further, in the Schottky region 100S, the Schottky contact hole 151c that exposes the second silicon carbide semiconductor layer 106 is formed in the interlayer insulating film 111 and the gate insulating film 107. The Schottky electrode 151 is provided to contact with the second silicon carbide semiconductor layer 106. Here, a barrier metal layer that functions as the Schottky electrode may be provided to contact with the second silicon carbide semiconductor layer 106.

In the Schottky contact hole 151c, a portion of the second silicon carbide semiconductor layer 106 may be etched, and at least a portion of the second silicon carbide semiconductor layer 106 may remain. In this case, the Schottky electrode 151 directly contacts with the second silicon carbide semiconductor layer 106. The concentration of the second silicon carbide semiconductor layer 106 on a contact surface with the Schottky electrode 151 may be lower than the average concentration of the second silicon carbide semiconductor layer 106 in the perpendicular direction to the main surface of the substrate 101. In other words, the second silicon carbide semiconductor layer 106 may have concentration distribution in the perpendicular direction to the main surface of the substrate 101, and the concentration on the side that contacts with the Schottky electrode 151 may be lower than the concentration on the side that contacts with the first silicon carbide semiconductor layer 102. In addition, the concentration on the side of the second silicon carbide semiconductor layer 106 that contacts with the Schottky electrode 151 may be lower than the concentration on the surface of the first silicon carbide semiconductor layer 102. Rectification of the Schottky junction is determined by a work function of the Schottky electrode and electron affinity of a semiconductor. In a case where the impurity concentration of the semiconductor is high, the depletion layer that is formed from a Schottky interface toward the semiconductor is less likely to spread, thus increasing the existence probability of carriers that tunnel through a Schottky barrier formed on the interface. That is, a leakage current in the Schottky junction increases. Accordingly, in a case where the concentration of the side of the second silicon carbide semiconductor layer 106 that contacts with the Schottky electrode 151 is set lower than the concentration of the side that contacts with the first silicon carbide semiconductor layer 102, the leakage current of the Schottky-barrier diode may be reduced compared to a case of employing the second silicon carbide semiconductor layer that is uniformly doped with impurities in the perpendicular direction to the main surface of the substrate 101. Further, in a case where the concentration of the side of the second silicon carbide semiconductor layer 106 that contacts with the Schottky electrode 151 is set lower than the concentration on the surface of the first silicon carbide semiconductor layer 102, the leakage current of the Schottky-barrier diode may be reduced compared to a case where the Schottky electrode 151 directly contacts with the first silicon carbide semiconductor layer 102.

One example of the second silicon carbide semiconductor layer 106 may be a silicon carbide epitaxial layer that has a structure in which a doped layer with a high impurity concentration and an undoped layer with a lower impurity concentration than the doped layer are stacked. Specifically, the second silicon carbide semiconductor layer 106 may have a structure in which the doped layer (thickness: 25 nm, for example) that has an impurity concentration of $1.4 \times 10^{18}$ cm$^{-3}$, for example, and the undoped layer (thickness: 25 nm, for example) that actually has an impurity concentration of $5 \times 10^{15}$ cm$^{-3}$ or lower are stacked on the first silicon carbide semiconductor layer 102 in this order. The impurity concentration of the undoped layer is not particularly limited but may be lower than the impurity concentration of the drift region 102d ($1 \times 10^{16}$ cm$^{-3}$, for example) of the first silicon carbide semiconductor layer 102. Accordingly, the impurity concentration of the surface of the second silicon carbide semiconductor layer 106 may be made lower than the impurity concentration of the surface of the first silicon carbide semiconductor layer 102.

The above-described second silicon carbide semiconductor layer 106 may be formed as follows. First, for example, the doped layer in a thickness of 25 nm and the undoped layer in a thickness of 75 nm are sequentially deposited on the first silicon carbide semiconductor layer 102. The above-described sacrificial oxidation and gate insulating film (thermal oxidation film) formation steps are thereafter performed. A surface portion of the undoped layer is thereby thermally oxidized, thereby forming the gate insulating film. The thickness of the undoped layer decreases by those steps and becomes 25 nm, for example.

Modification Example 1-4

Figure 15:
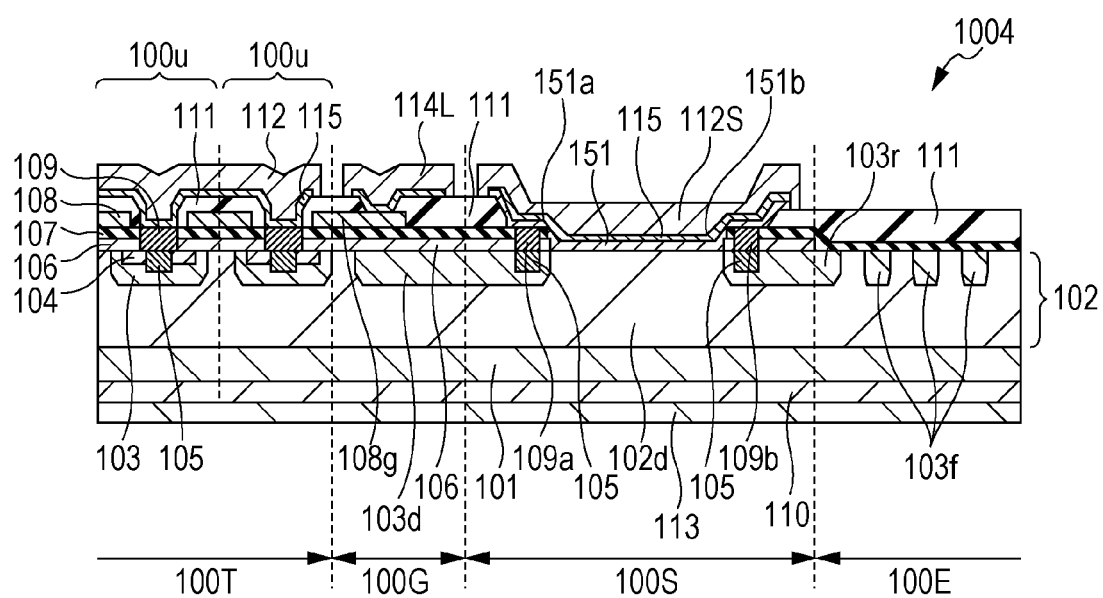
FIG. 15 is a cross-sectional view taken along line 15-15 of a semiconductor device illustrated in FIG. 16A as yet another modification example of the first embodiment.
Figure 16A:
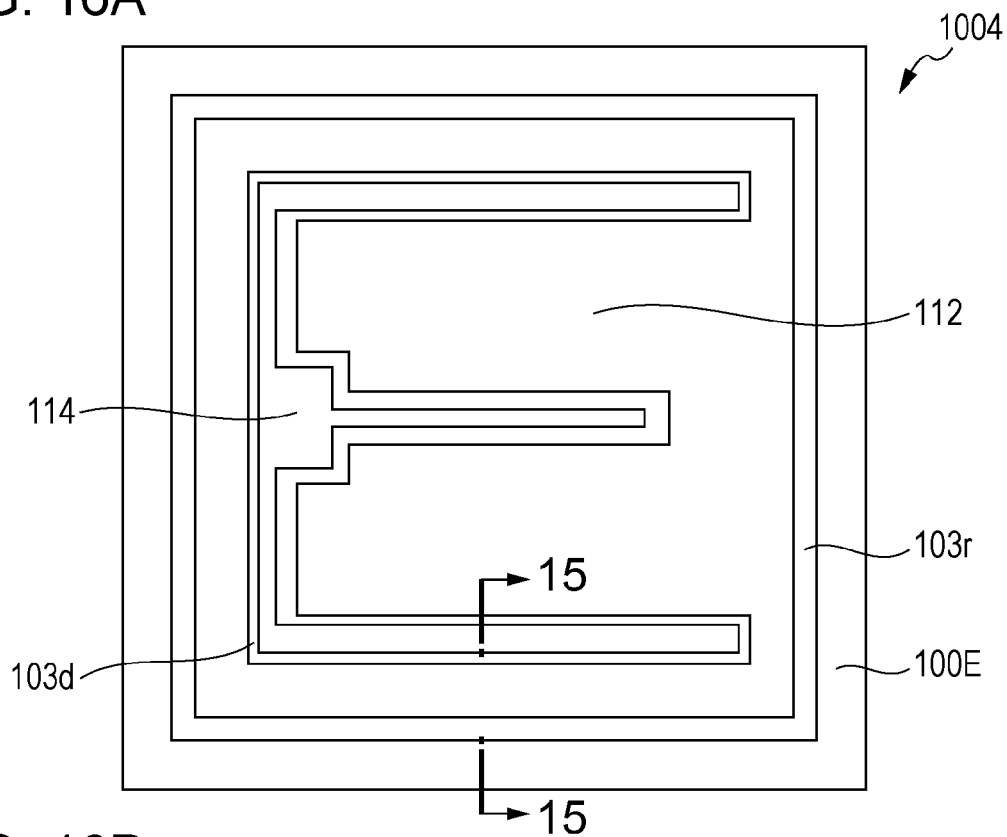
FIG. 16A is a top view that illustrates arrangement of the gate wiring layer and the upper wiring layer of the semiconductor device.
Figure 16B:
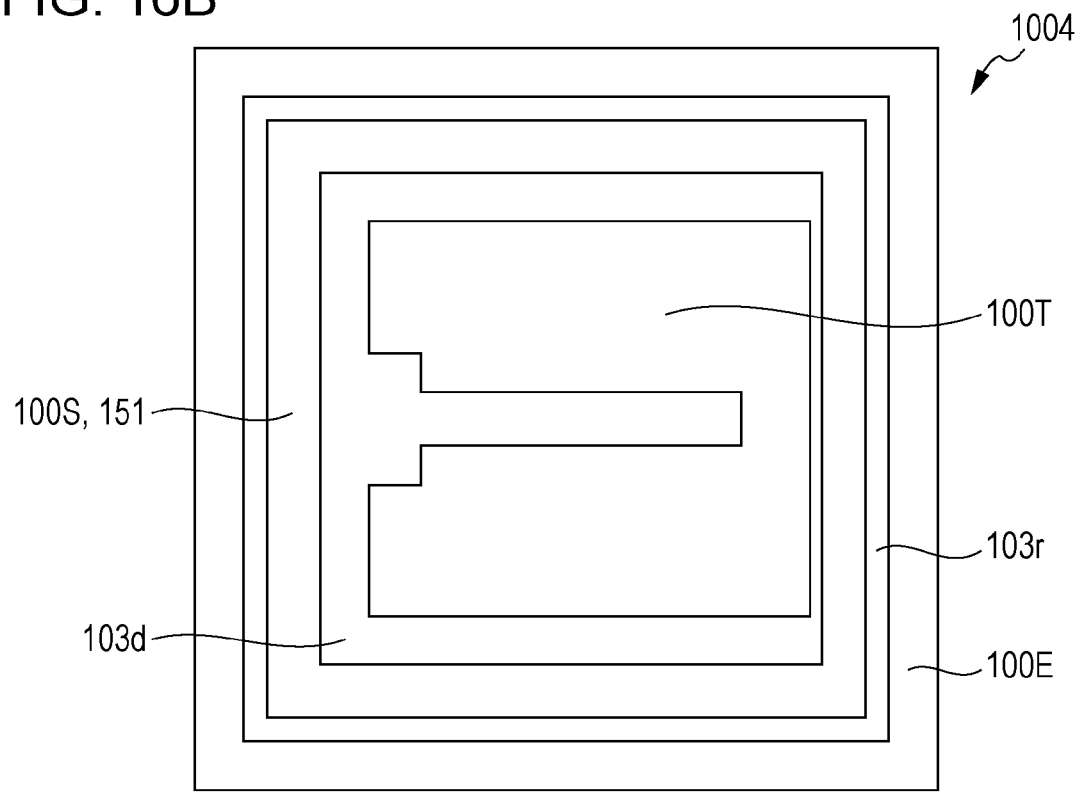
FIG. 16B is a top view that illustrates arrangement of the transistor region, the Schottky region, and the boundary region.

FIG. 15 is a cross-sectional view that illustrates a semiconductor device 1004 as yet another modification example of this embodiment. FIG. 16A is a top view for explaining arrangement of the upper wiring layer 112 and the gate wiring layer 114 in the semiconductor device 1004. FIG. 16B is a top view for explaining arrangement of the regions that are formed below the upper wiring layer 112 and the gate wiring layer 114 in the semiconductor device 1004.

The semiconductor device 1004 has the second silicon carbide semiconductor layer 106 similarly to the semiconductor device 1002 illustrated in FIGS. 13A and 13B. However, the second silicon carbide semiconductor layer 106 is also arranged on the guard ring region 103r. Further, the semiconductor device 1004 is different from the semiconductor device 1002 in the following points.

In this modification example, the diode cell is not arranged at the end of the transistor region 100T. The first electrode 109a is arranged to be electrically connected with the second body region 103d in the Schottky region 100S. The first electrode 109a may be arranged to contact with the contact region 105 that is formed in the second body region 103d. The diode is thereby configured. In this example, an upper surface of the first electrode 109a contacts with the Schottky electrode 151 and is electrically connected with the upper wiring layer 112 via the Schottky electrode 151.

Further, the semiconductor device 1004 has a second electrode 109b so as to be electrically connected with the guard ring region 103r. This enables effective enhancement of avalanche resistance. Here, the contact region 105 is provided in the guard ring region 103r, and the second electrode 109b is arranged on the contact region 105. An upper surface of the second electrode 109b contacts with the Schottky electrode 151 and is electrically connected with the upper wiring layer 112 via the Schottky electrode 151.

Figure 17:
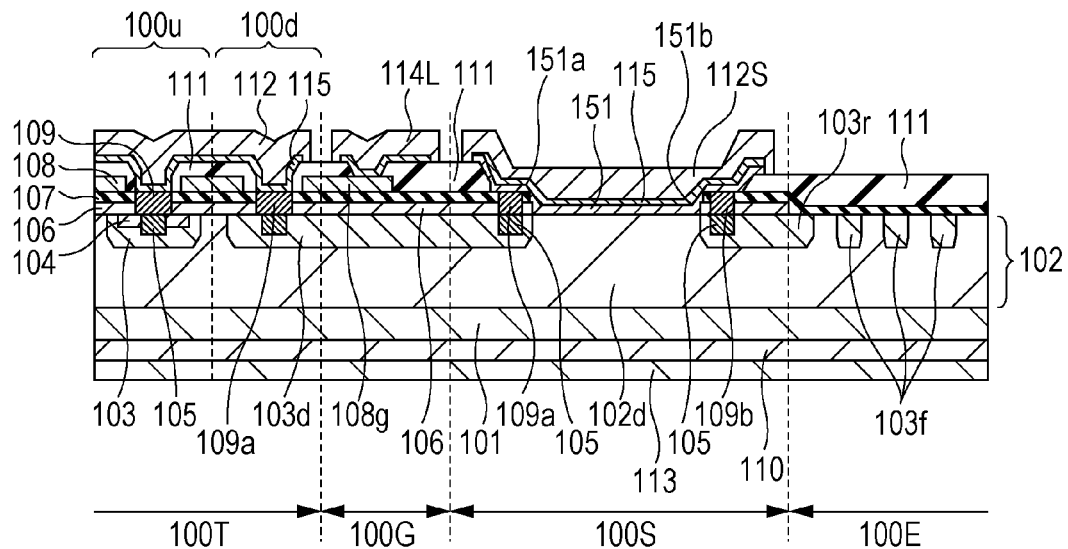
FIG. 17 is a cross-sectional view that exemplarily illustrates a semiconductor device as the yet other modification example of the first embodiment.
Figure 18:
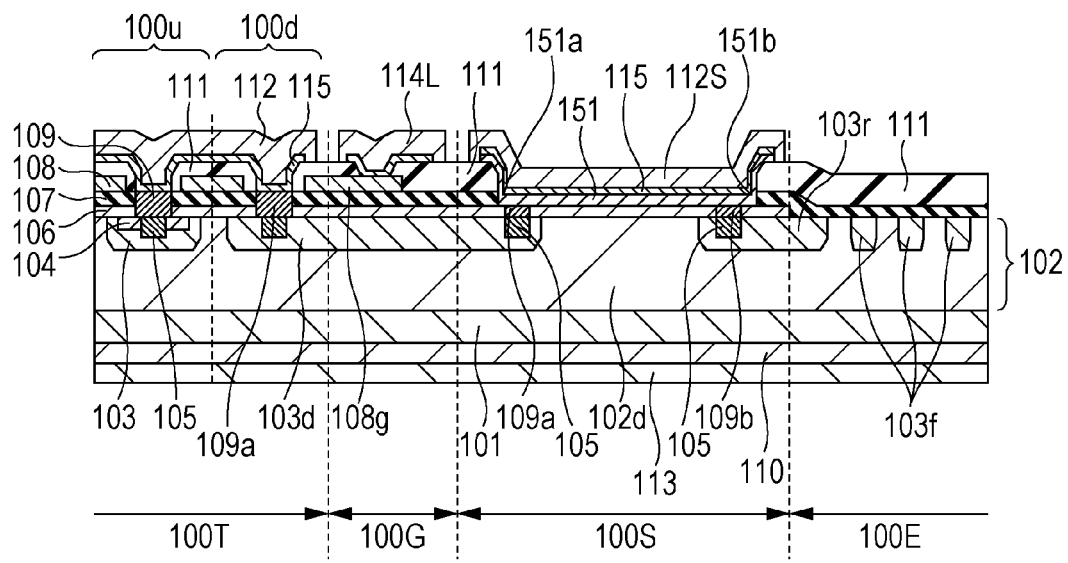
FIG. 18 is a cross-sectional view that exemplarily illustrates a semiconductor device as the yet other modification example of the first embodiment.

Further, in this modification example, as illustrated in FIG. 17, the first electrode 109a may further be arranged in the second body region 103d at the end of the transistor region 100T, and a portion of the second body region 103d and the first electrode 109a may configure the diode cell 100d. As illustrated in FIG. 18, similarly to the modification example 1-4, the second silicon carbide semiconductor layer 106 may be arranged not only in the transistor region 100T and the boundary region 100G but also in the Schottky region 100S.

Modification Example 1-5

Figure 19:
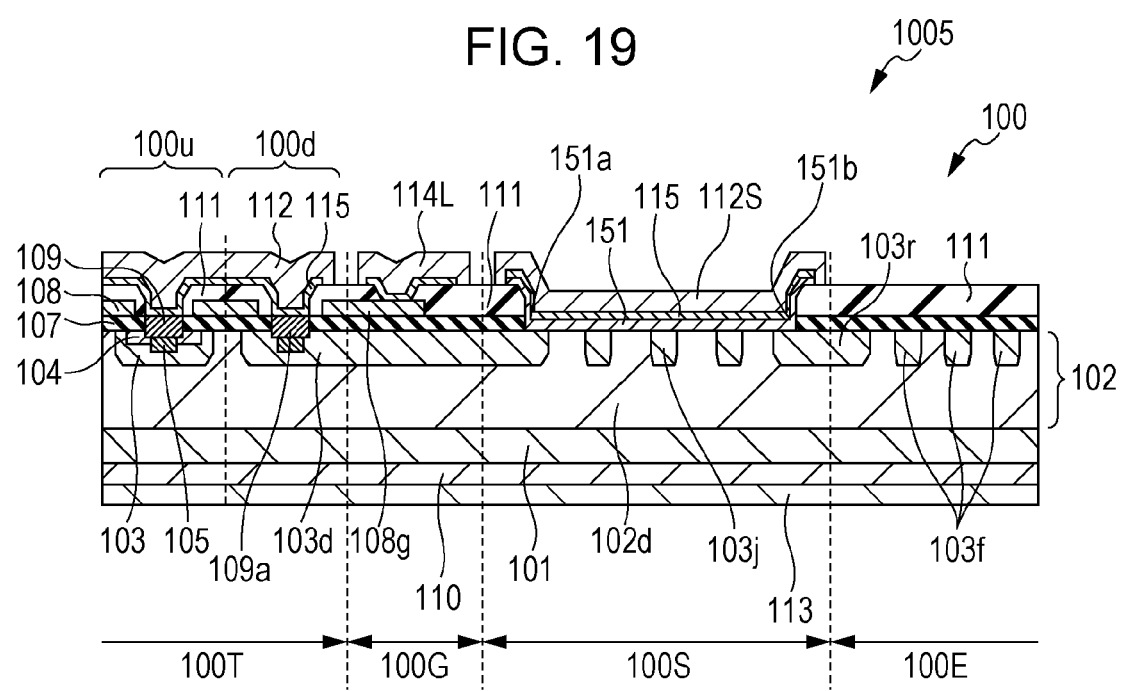
FIG. 19 is a cross-sectional view that exemplarily illustrates a semiconductor device as yet another modification example of the first embodiment.

FIG. 19 is a cross-sectional view that illustrates a semiconductor device 1005 as yet another modification example of this embodiment.

The semiconductor device 1005 is different from the semiconductor device 100 illustrated in FIGS. 3A and 3B in the following points.

In the semiconductor device 1005 has at least one second conductive type region 103j in a portion of a region of the first silicon carbide semiconductor layer 102 that is positioned between the second body region 103d and the guard ring region 103r in the Schottky region 100S. The second conductive type region 103j may simultaneously be formed with the body region 103 in a similar process to the body region 103. In this example, two second conductive type regions 103j are arranged at an interval. The second conductive type regions 103j and a region of the first conductive type where the second conductive type regions are not formed in the first silicon carbide semiconductor layer 102 contacts with the Schottky electrode 151. The Schottky-barrier diode that has the JBS structure is thereby formed in the Schottky region 100S.

In the modification examples 1-2 to 1-5, a portion of the barrier metal layer 115 may be used as the Schottky electrode 151 as described in the modification example 1-1.

In a case where the semiconductor device of the first embodiment is the MISFET that has the free-wheeling diode, an effective area of the MISFET may be larger than the effective area of the Schottky region. The effective area of the MISFET is the total area of the transistor cells in the transistor region when seen in the normal line direction of the main surface of the substrate. The effective area of the Schottky region is the total region of portions in which the Schottky electrode contacts with the first silicon carbide semiconductor layer that includes the second body region and the guard ring region.

In the above first embodiment, the edge termination region has a so-called floating limiting ring (FLR) structure that has the ring region of the second conductive type. However, a structure of the edge termination region is not limited to this. For example, the edge termination region may have a so-called junction termination extension (JTE) structure that has a concentration gradient of second conductive type impurities toward a periphery of the semiconductor device.

For example, in a case where the second silicon carbide semiconductor layer that functions as the channel layer is not provided as in the semiconductor device 100 illustrated in FIGS. 3A and 3B, the concentration of first conductive type impurities in the channel layer may be changed by further implanting the first conductive type impurities in a prescribed region of the surface of the first silicon carbide semiconductor layer 102.

In the above first embodiment, an example where silicon carbide is 4H—SiC is described. However, silicon carbide may be other polytypes such as 6H—SiC, 3C—SiC, and 15R—SiC. Further, an SiC substrate whose main surface is an off-cut surface from the (0001) plane is used as the substrate 101. However, an SiC substrate whose main surface is the (11-20) plane, the (1-100) plane, the (000-1) plane, or an off-cut surface from those may be used instead. Further, the substrate 101 may be an Si substrate, and the first silicon carbide semiconductor layer 102 may be a 3C—SiC layer. In this case, annealing for activating impurity ions that are implanted in the 3C—SiC layer may be conducted at a temperature of the melting point of the Si substrate or lower.

A semiconductor device according to one aspect of the present disclosure is useful for a semiconductor device that uses both of a diode and a transistor and particularly useful for a power semiconductor device to be installed in a vehicle and in a power converter for an industrial apparatus.

What is claimed is:

1. A semiconductor device, comprising:
   a substrate which has a front surface and a back surface;
   a first silicon carbide semiconductor layer of a first conductive type which is arranged on the front surface of the substrate;
   a body region of a second conductive type that is positioned at least in a portion of a surface of the first silicon carbide semiconductor layer;
   a source region of the first conductive type that contacts with the body region;
   a gate insulating film that covers at least a portion of the body region;
   a gate electrode that is arranged on the gate insulating film;
   a source electrode that is electrically connected with the source region;
   a drain electrode that is arranged on the back surface of the substrate;
   a second body region of the second conductive type that is positioned at least in a portion of the surface of the first silicon carbide semiconductor layer;
   a gate connector that is arranged on the second body region via an insulating film and electrically connected with the gate electrode;
   a guard ring region of the second conductive type that is positioned at least in a portion of the surface of the first silicon carbide semiconductor layer;
   a Schottky electrode that is arranged on a portion of the guard ring region and on the first silicon carbide semiconductor layer;
   at least one ring region of the second conductive type that is positioned in the surface of the first silicon carbide semiconductor layer;
   a first electrode that is electrically connected with the second body region;
   an upper wiring layer that connects the source electrode and the first electrode with the Schottky electrode;
   gate wiring that is electrically connected with the gate connector; and
   a gate pad that is electrically connected with the gate connector and the gate wiring, wherein:
   a region that includes the body region, the source region, the gate insulating film, the gate electrode, the source electrode and the drain electrode is defined as a transistor cell;
   a region that includes a plurality of the transistor cells is defined as a transistor region;
   a region that includes the second body region and the gate connector is defined as a boundary region;
   a region that includes the guard ring region and the Schottky electrode is defined as a Schottky region;
   a region that includes the at least one ring region is defined as an edge termination region;
   the boundary region is positioned between the transistor region and the Schottky region when the boundary region is seen in a normal line direction of the front surface of the substrate,
   the Schottky region surrounds the transistor region when the Schottky region is seen in the normal line direction of the front surface of the substrate;
   the edge termination region is arranged outside of the transistor region, the Schottky region, and the boundary region when the edge termination region is seen in the normal line direction of the front surface of the substrate;
   at least a portion of the gate wiring and at least a portion of the gate pad are arranged in the boundary region; and
   the second body region extends from the boundary region to the Schottky region and is arranged below a portion of the Schottky electrode.

2. The semiconductor device according to claim 1, wherein the at least one ring region comprises plural ring regions that are arranged at intervals in the surface of the first silicon carbide semiconductor layer.

3. The semiconductor device according to claim 1, further comprising:
   a barrier metal layer that is arranged between the upper wiring layer and the source electrode, between the upper wiring layer and the first electrode, and between the gate wiring and the gate connector.

4. The semiconductor device according to claim 3, wherein the barrier metal layer and the Schottky electrode are made of a same metal material.

5. The semiconductor device according to claim 1, further comprising:
   a second silicon carbide semiconductor layer of the first conductive type between the first silicon carbide semiconductor layer and the gate insulating film,
   wherein the transistor cell further includes the second silicon carbide semiconductor layer.

6. The semiconductor device according to claim 5, wherein the second silicon carbide semiconductor layer is further arranged between the Schottky electrode and the first silicon carbide semiconductor layer.

7. The semiconductor device according to claim 6, wherein an impurity concentration of the first conductive type in a contact surface of the second silicon carbide semiconductor layer that contacts with the Schottky electrode is lower than an average impurity concentration of the second silicon carbide semiconductor layer in a thickness direction.

8. The semiconductor device according to claim 5, wherein the second silicon carbide semiconductor layer is an epitaxial layer.

9. The semiconductor device according to claim 1, further comprising:
   at least one second conductive type region that is arranged at an interval from the second body region and the guard ring region in a portion of the surface of the first silicon carbide semiconductor layer, wherein:
   the Schottky region further includes the at least one second conductive type region, and
   the Schottky electrode contacts with both of the at least one second conductive type region and a region of the first conductive type in the first silicon carbide semiconductor layer.

* * * * *